(12) United States Patent
Shatalov et al.

(10) Patent No.: US 9,923,118 B2
(45) Date of Patent: *Mar. 20, 2018

(54) SEMICONDUCTOR STRUCTURE WITH INHOMOGENEOUS REGIONS

(71) Applicant: Sensor Electronic Technology, Inc., Columbia, SC (US)

(72) Inventors: Maxim S. Shatalov, Columbia, SC (US); Alexander Dobrinsky, Loudonville, NY (US); Rakesh Jain, Columbia, SC (US); Michael Shur, Latham, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/225,403

(22) Filed: Aug. 1, 2016

(65) Prior Publication Data

US 2016/0336483 A1 Nov. 17, 2016

Related U.S. Application Data

(63) Continuation-in-part of application No. 14/984,156, filed on Dec. 30, 2015, which is a
(Continued)

(51) Int. Cl.
*H01L 33/10* (2010.01)
*H01L 33/32* (2010.01)
(Continued)

(52) U.S. Cl.
CPC ........... *H01L 33/10* (2013.01); *H01L 33/007* (2013.01); *H01L 33/32* (2013.01);
(Continued)

(58) Field of Classification Search
CPC ........ H01L 33/007; H01L 33/10; H01L 33/32
See application file for complete search history.

(56) References Cited

U.S. PATENT DOCUMENTS 5,602,418 A * 2/1997 Imai ............... H01L 31/1852
251/82
7,812,366 B1 10/2010 Sampath et al.
(Continued)

FOREIGN PATENT DOCUMENTS

WO 2013023197 A2 2/2013

OTHER PUBLICATIONS

Shatalov, M. et al., "AlGaN Deep-Ultraviolet Light-Emitting Diodes with External Quantum Efficiency above 10%," Applied Physics Express, Jul. 2012, 3 pages, vol. 5, No. 8.
(Continued)

*Primary Examiner* — Fazli Erdem
(74) *Attorney, Agent, or Firm* — LaBatt, LLC

(57) ABSTRACT

A semiconductor layer including a plurality of inhomogeneous regions is provided. Each inhomogeneous region has one or more attributes that differ from a material forming the semiconductor layer. The inhomogeneous regions can include one or more regions configured based on radiation having a target wavelength. These regions can include transparent and/or reflective regions. The inhomogeneous regions also can include one or more regions having a higher conductivity than a conductivity of the radiation-based regions, e.g., at least ten percent higher. In one embodiment, the semiconductor layer is used to form an optoelectronic device.

20 Claims, 18 Drawing Sheets

Related U.S. Application Data continuation-in-part of application No. 14/189,012, filed on Feb. 25, 2014, now Pat. No. 9,331,244.

(60) Provisional application No. 61/768,581, filed on Feb. 25, 2013.

(51) Int. Cl.
    *H01L 33/00*     (2010.01)
    *H01L 33/12*     (2010.01)
    *H01L 33/46*     (2010.01)
    *H01S 5/022*     (2006.01)

(52) U.S. Cl.
    CPC .......... *H01L 33/0079* (2013.01); *H01L 33/12* (2013.01); *H01L 33/46* (2013.01); *H01S 5/0224* (2013.01)

(56) References Cited

U.S. PATENT DOCUMENTS

| | | | |
|---|---|---|---|
| 9,331,244 B2 | 5/2016 | Shatalov et al. | |
| 2004/0031956 A1* | 2/2004 | Saxler | H01L 21/02378 257/14 |
| 2009/0272993 A1 | 11/2009 | Cheong | |
| 2013/0146907 A1 | 6/2013 | Lunev et al. | |
| 2013/0270514 A1* | 10/2013 | Saxler | H01L 33/08 257/13 |
| 2013/0320352 A1 | 12/2013 | Gaevski et al. | |
| 2014/0016660 A1 | 1/2014 | Lunev et al. | |
| 2014/0110754 A1 | 4/2014 | Jain et al. | |
| 2014/0134773 A1 | 5/2014 | Jain et al. | |
| 2015/0243840 A1* | 8/2015 | Johnston | H01L 33/12 257/13 |
| 2015/0372193 A1* | 12/2015 | Jain | H01L 33/32 257/98 |
| 2016/0118536 A1* | 4/2016 | Shatalov | H01L 33/10 257/13 |
| 2016/0197228 A1* | 7/2016 | Shatalov | H01L 33/32 257/94 |
| 2016/0315219 A1 | 10/2016 | Shur et al. | |
| 2016/0336483 A1 | 11/2016 | Shatalov et al. | |

OTHER PUBLICATIONS

White, S., U.S. Appl. No. 14/189,012, Notice of Allowance, dated Dec. 30, 2015, 8 pages.
White, S., U.S. Appl. No. 14/189,012, Ex Parte Quayle, dated Sep. 24, 2015, 17 pages.
Erdem, F., U.S. Appl. No. 14/984,156, Office Action1, dated Feb. 8, 2017, 21 pages.
Erdem, F., U.S. Appl. No. 14/984,156, Final Office Action1, dated Aug. 4, 2017, 14 pages.
Tran, M., U.S. Appl. No. 15/069,178, Office Action1, dated Aug. 1, 2017, 18 pages.
Tran, M., U.S. Appl. No. 15/069,178, Notice of Allowance, Oct. 26, 2017, 12 pages.
Erdem, F., U.S. Appl. No. 14/984,156, Notice of Allowance, Oct. 27, 2017, 14 pages.

\* cited by examiner

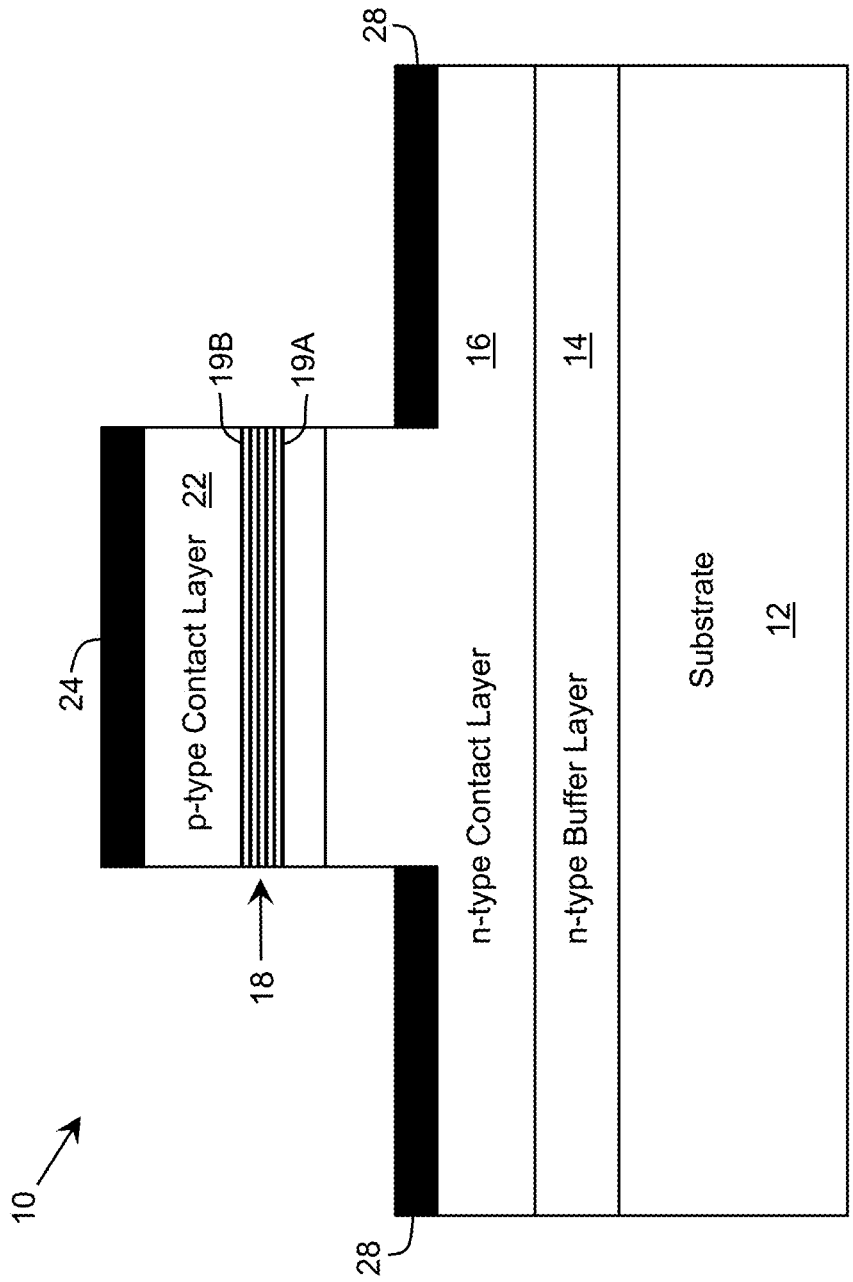

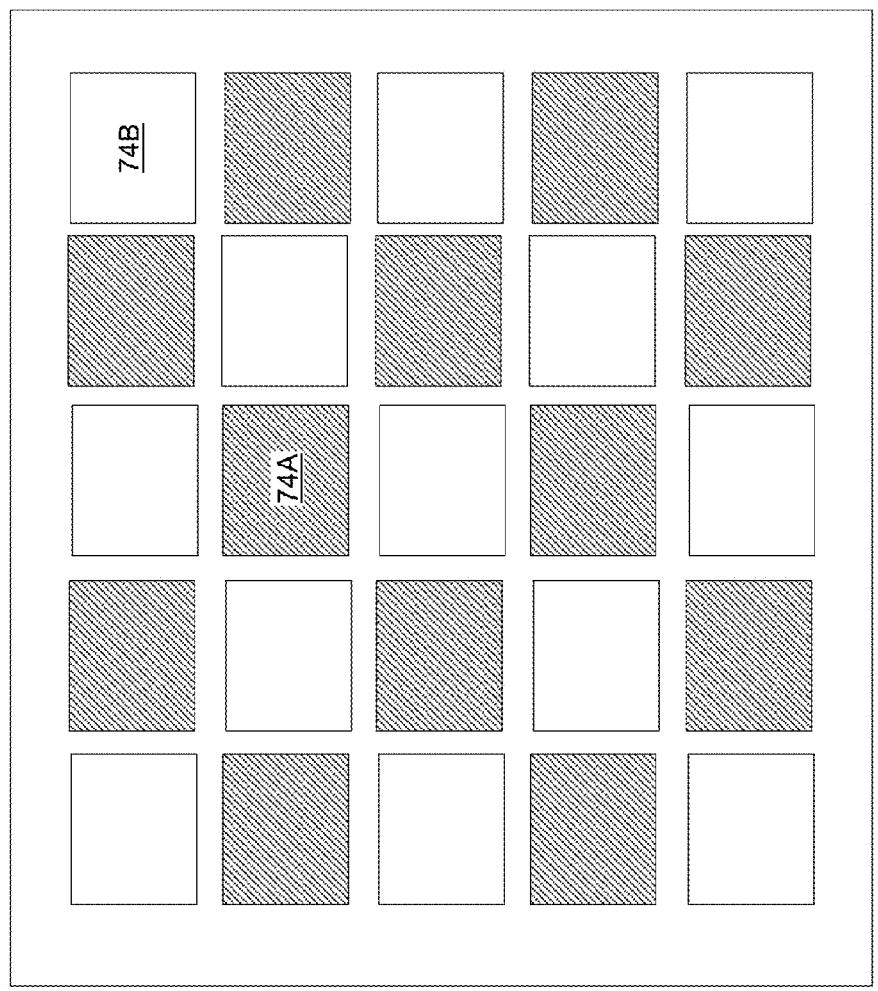

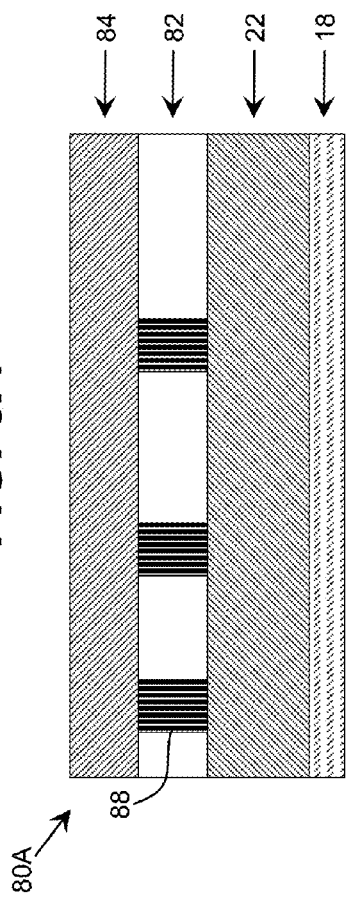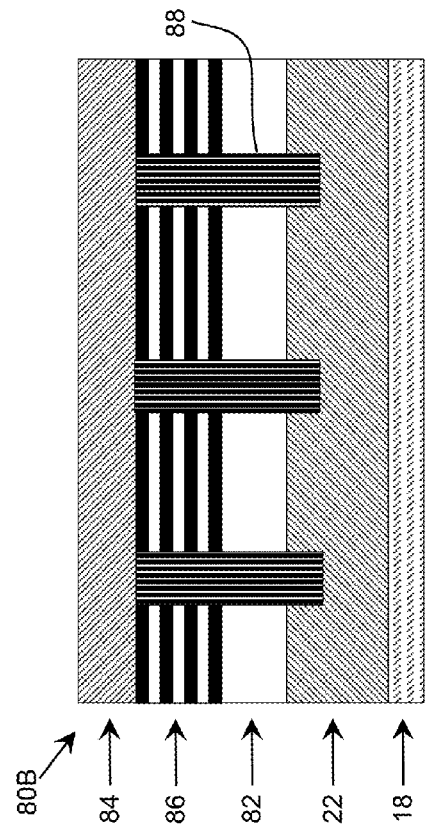

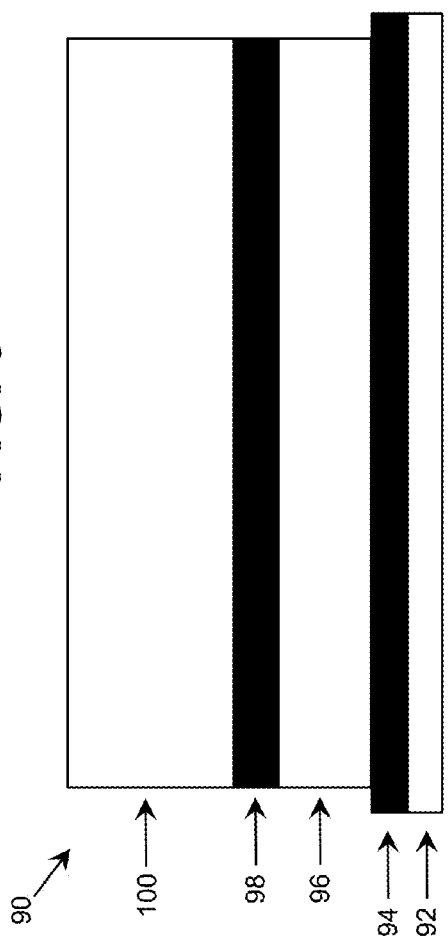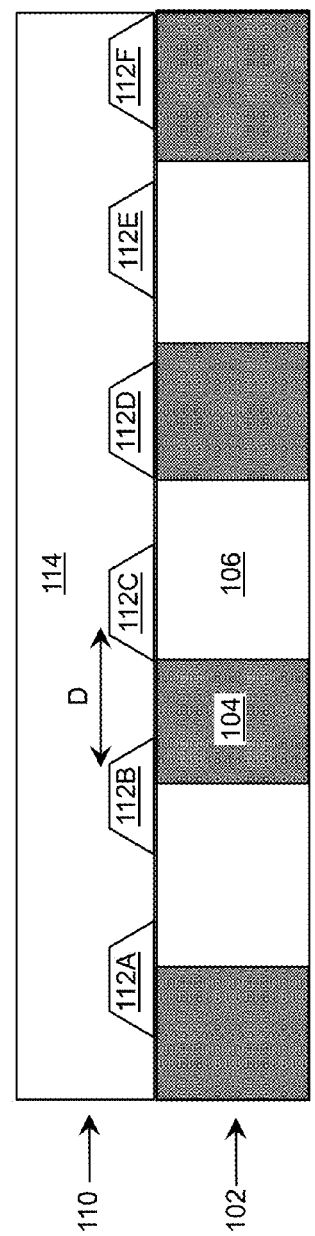

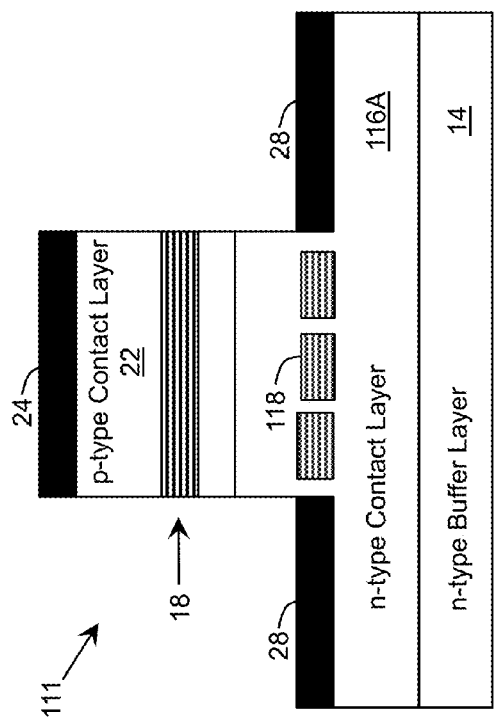
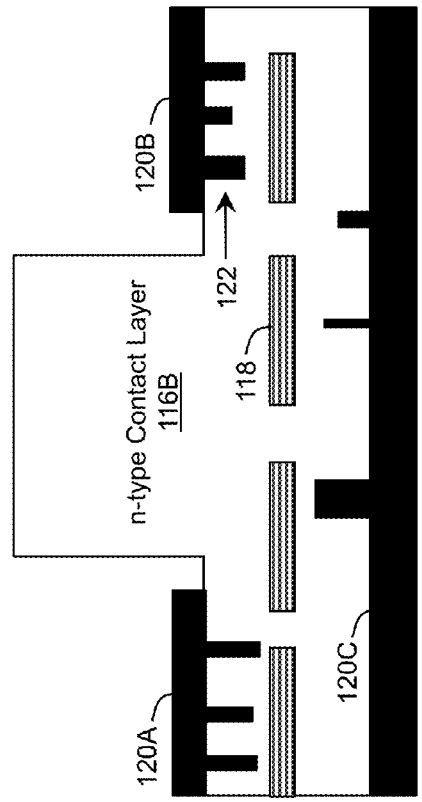

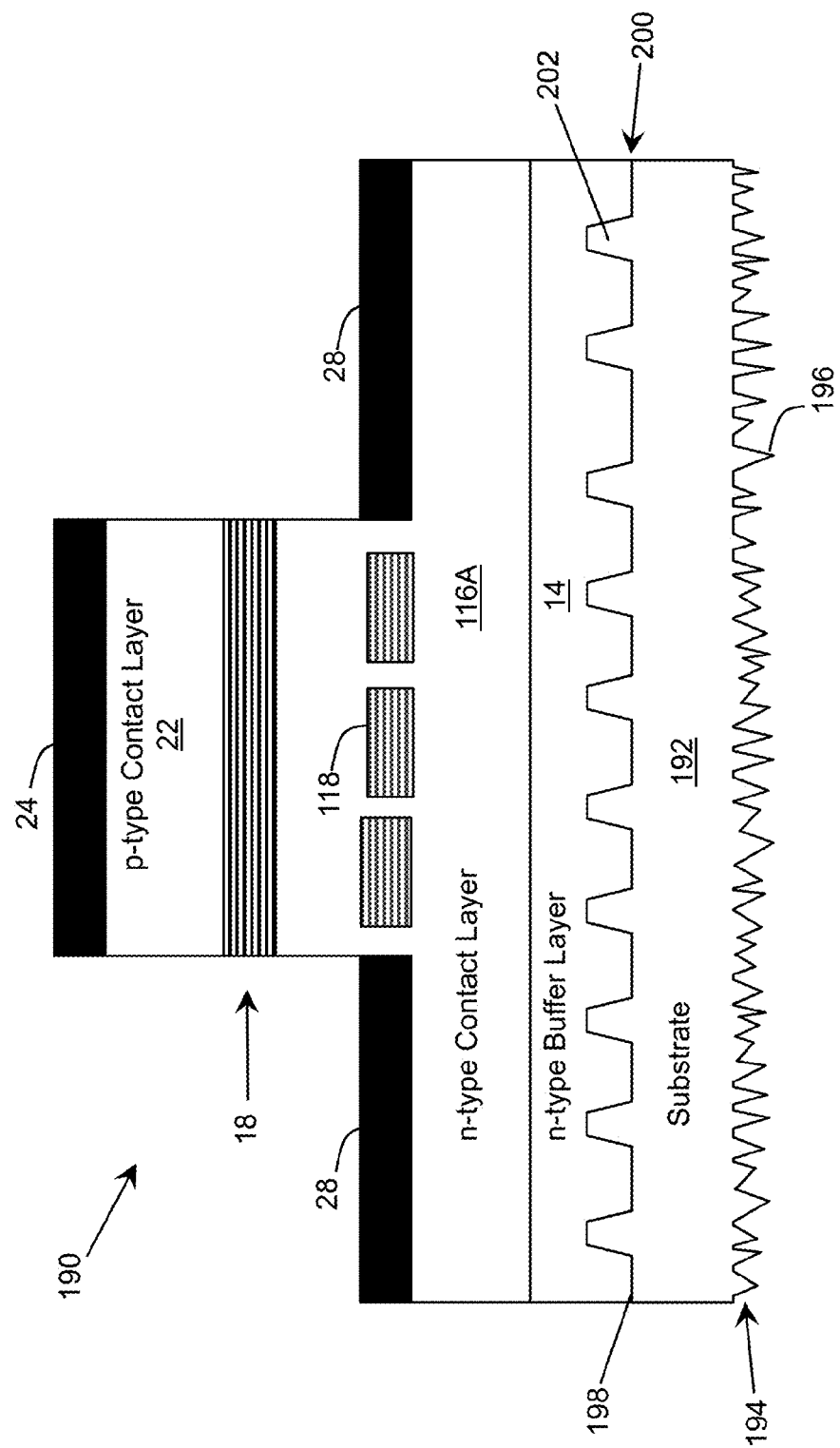

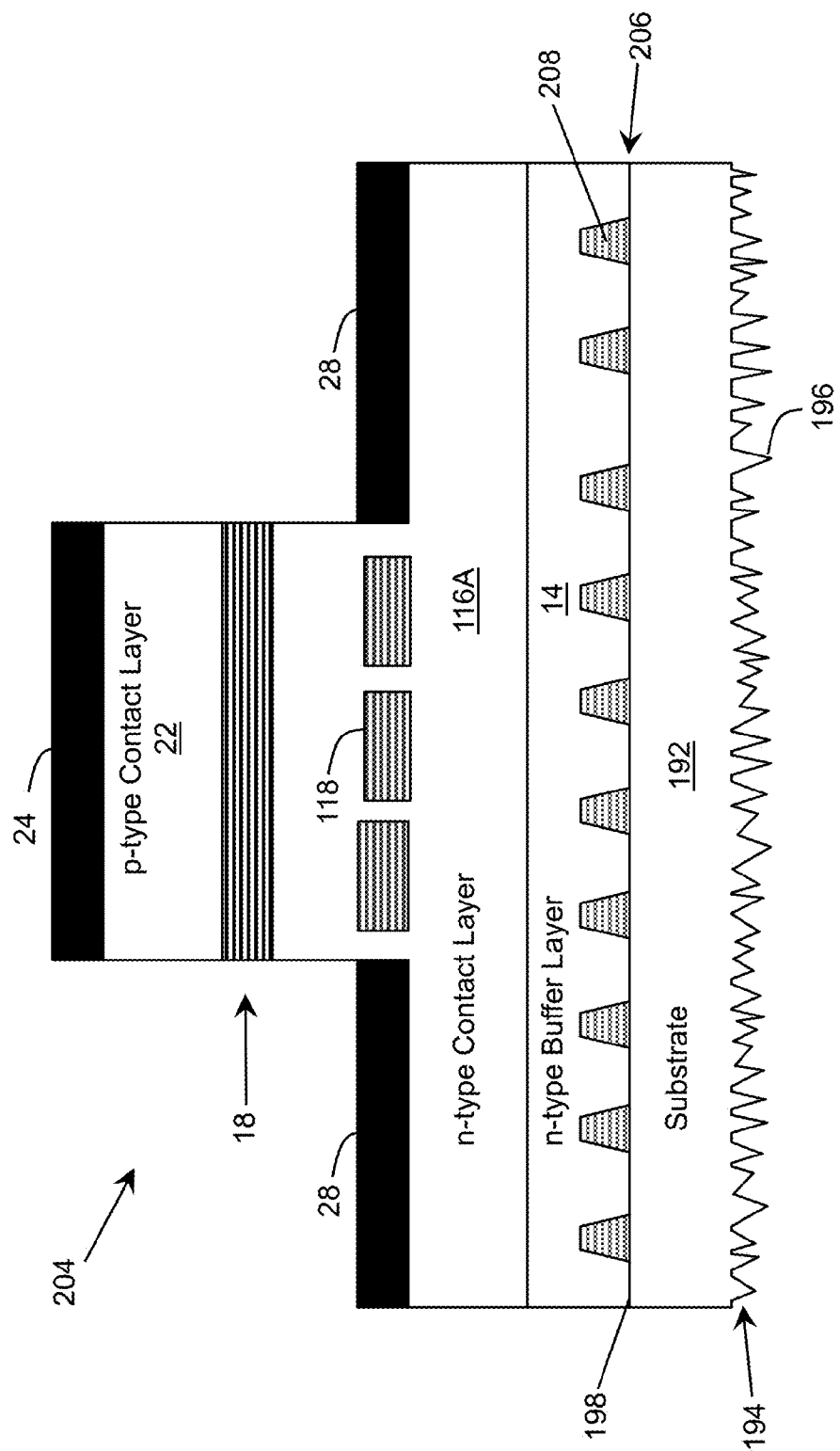

SEMICONDUCTOR STRUCTURE WITH INHOMOGENEOUS REGIONS

REFERENCE TO RELATED APPLICATIONS

The present patent application is a continuation-in-part of U.S. application Ser. No. 14/984,156, entitled "Semiconductor Structure with Inhomogeneous Regions," which was filed on 30 Dec. 2015, which is a continuation-in-part application of U.S. application Ser. No. 14/189,012, entitled "Semiconductor Structure with Inhomogeneous Regions," which was filed on 25 Feb. 2014, which claims the benefit of U.S. Provisional Application No. 61/768,581, entitled "Reflective, Transparent, Conductive Semiconductor Structure, Optoelectronic Device With The Same, and Method of Making The Same," which was filed on 25 Feb. 2013, each of which is hereby incorporated by reference in its entirety to provide continuity of disclosure. Aspects of the invention also are related to U.S. patent application Ser. No. 15/069,178, filed on 14 Mar. 2016, which is a continuation of U.S. application Ser. No. 14/189,012, which was filed on 25 Feb. 2014.

TECHNICAL FIELD

The disclosure relates generally to semiconductor devices, and more particularly, to emitting semiconductor devices, such as deep ultraviolet light emitting devices.

BACKGROUND ART

Semiconductor emitting devices, such as light emitting diodes (LEDs) and laser diodes (LDs), include, but are not limited to, solid state emitting devices composed of group III-V semiconductors. A subset of group III-V semiconductors includes group III-Nitride alloys, which can include binary, ternary and quaternary alloys of indium (In), aluminum (Al), gallium (Ga), and nitrogen (N). Illustrative group III-Nitride based LEDs and LDs can be of the form $In_yAl_xGa_{1-x-y}N$, where x and y indicate the molar fraction of a given element, $0 \leq x$, $y \leq 1$, and $0 \leq x+y \leq 1$. Other illustrative group III-Nitride based LEDs and LDs are based on boron (B) nitride (BN) and can be of the form $Ga_zIn_yAl_xB_{1-x-y-z}N$, where $0 \leq x$, $y$, $z \leq 1$, and $0 \leq x+y+z \leq 1$.

An LED is typically composed of semiconducting layers. During operation of the LED, a voltage bias applied across doped layers leads to injection of electrons and holes into an active layer where electron-hole recombination leads to light generation. Light is generated in the active layer with uniform angular distribution and escapes the LED die by traversing semiconductor layers in all directions. Each semiconducting layer has a particular combination of molar fractions for the various elements (e.g., given values of x, y, and/or z), which influences the optical properties of the semiconducting layer. In particular, a refractive index and absorption characteristics of a semiconducting layer are sensitive to the molar fractions of the semiconductor alloy forming the layer.

Current state of the art deep ultraviolet LEDs (DUV LEDs) have a low efficiency due to light trapping within the device, light absorption in the semiconductor layers, as well as light absorption in the contact regions. To improve light extraction efficiency for the DUV LEDs, one approach proposes a design using ultraviolet transparent p-type cladding and contact layers, an ultraviolet reflecting ohmic contact, and chip encapsulation having an optimized shape and refractive index.

SUMMARY OF THE INVENTION

This Summary Of The Invention introduces a selection of certain concepts in a brief form that are further described below in the Detailed Description Of The Invention. It is not intended to exclusively identify key features or essential features of the claimed subject matter set forth in the Claims, nor is it intended as an aid in determining the scope of the claimed subject matter.

Aspects of the invention provide a semiconductor layer including a plurality of inhomogeneous regions. Each inhomogeneous region has one or more attributes that differ from a material forming the semiconductor layer. The inhomogeneous regions can include one or more regions configured based on radiation having a target wavelength. These regions can include transparent and/or reflective regions. The inhomogeneous regions also can include one or more regions having a higher conductivity than a conductivity of the radiation-based regions, e.g., at least ten percent higher. In one embodiment, the semiconductor layer can be used to form an optoelectronic device.

A first aspect of the invention provides a semiconductor heterostructure comprising: an active region configured to at least one of: emit or sense, target radiation having a target wavelength; a contact; and a group III nitride semiconductor layer located between the active region and the contact, the group III semiconductor layer including a plurality of inhomogeneous regions arranged within multiple levels of the semiconductor layer, each having a set of attributes differing from a group III nitride material forming the group III semiconductor layer, wherein the plurality of inhomogeneous regions include at least one reflective region and at least one conductive region.

A second aspect of the invention provides a method, comprising: fabricating a semiconductor heterostructure, wherein the semiconductor heterostructure comprises: an active region configured to at least one of: emit or sense, target radiation having a target wavelength; and a group III nitride semiconductor layer located adjacent to the active region, the group III semiconductor layer including a plurality of inhomogeneous regions arranged within multiple levels of the semiconductor layer, each having a set of attributes differing from a group III nitride material forming the group III semiconductor layer, wherein the plurality of inhomogeneous regions include at least one reflective region and at least one conductive region.

A third aspect of the invention provides an optoelectronic device, comprising: an active region configured to at least one of: emit or sense, target radiation having a target wavelength; a p-type contact layer located on a first side of the active region; a n-type contact layer located on a second side of the active region, the n-type contact layer including a group III nitride semiconductor layer including a plurality of inhomogeneous regions, each inhomogeneous region having a set of attributes differing from a group III nitride material forming the group III semiconductor layer, wherein the plurality of inhomogeneous regions include a plurality of reflective regions each reflective of radiation having the target wavelength; a buffer layer located on a first side of the n-type contact layer opposite a second side thereof that is located adjacent to the active region; and a transparent substrate, located on a first side of the buffer layer opposite a second side thereof that is located adjacent to the n-type contact layer, wherein the transparent substrate is at least 80% transparent to a normally directed target radiation.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 2 shows a typical design of an emitting device including a mesa structure according to an embodiment.

FIG. 3A shows a layer including a plurality of reflective regions, while

FIGS. 7A-7C show illustrative arrangements of reflective regions according to embodiments.

FIGS. 8A and 8B show illustrative reflective regions comprising omnidirectional mirrors according to embodiments.

FIG. 9 shows an illustrative multilayered metallic contact according to an embodiment.

FIG. 10 shows an illustrative interface between a semiconductor layer and a metallic contact according to an embodiment.

FIGS. 11A-11C show illustrative n-type contact layers including reflective regions according to embodiments.

FIG. 14 shows a semiconductor heterostructure with a substrate having one side surface with roughness elements and another side surface patterned with protruding regions according to an embodiment.

FIG. 15 shows a semiconductor heterostructure with a substrate having one side surface with roughness elements and another side surface with masking regions according to an embodiment of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a semiconductor layer including a plurality of inhomogeneous regions. Each inhomogeneous region has one or more attributes that differ from a material forming the semiconductor layer. The inhomogeneous regions can include one or more regions configured based on radiation having a target wavelength. These regions can include transparent and/or reflective regions. The inhomogeneous regions also can include one or more regions having a higher conductivity than a conductivity of the radiation-based regions, e.g., at least ten percent higher. As used herein, unless otherwise noted, the term "set" means one or more (i.e., at least one) and the phrase "any solution" means any now known or later developed solution.

Aspects of the invention provide a semiconductor structure (e.g., a semiconductor layer) that can be incorporated into an optoelectronic device, such as a light emitting diode (LED), a vertical LED, a light emitting laser, a light sensor, a photodetector, an avalanche diode, and/or the like, after removing the semiconductor structure from a substrate using a technique, such as, for example, a laser lift off technique. The semiconductor structure can include inhomogeneous regions formed by one or more of: patterning, masking, epitaxial growth, epitaxial overgrowth, deposition techniques, and/or the like. Deposition techniques can include thermal evaporation, magnetron sputtering, ion-beam deposition, laser beam evaporation, and/or the like. In a more particular embodiment, the semiconductor structure comprises a group III nitride semiconductor layer. The inhomogeneous regions can include various types of inhomogeneous regions and can be located within the semiconductor structure in various arrangements. Aspects of the invention are further described in conjunction with emitting devices, such as group III nitride-based emitting devices, including an active region configured to generate radiation during operation of the device. However, it is understood that the invention can be applied to other types of optoelectronic devices.

Figure 1:
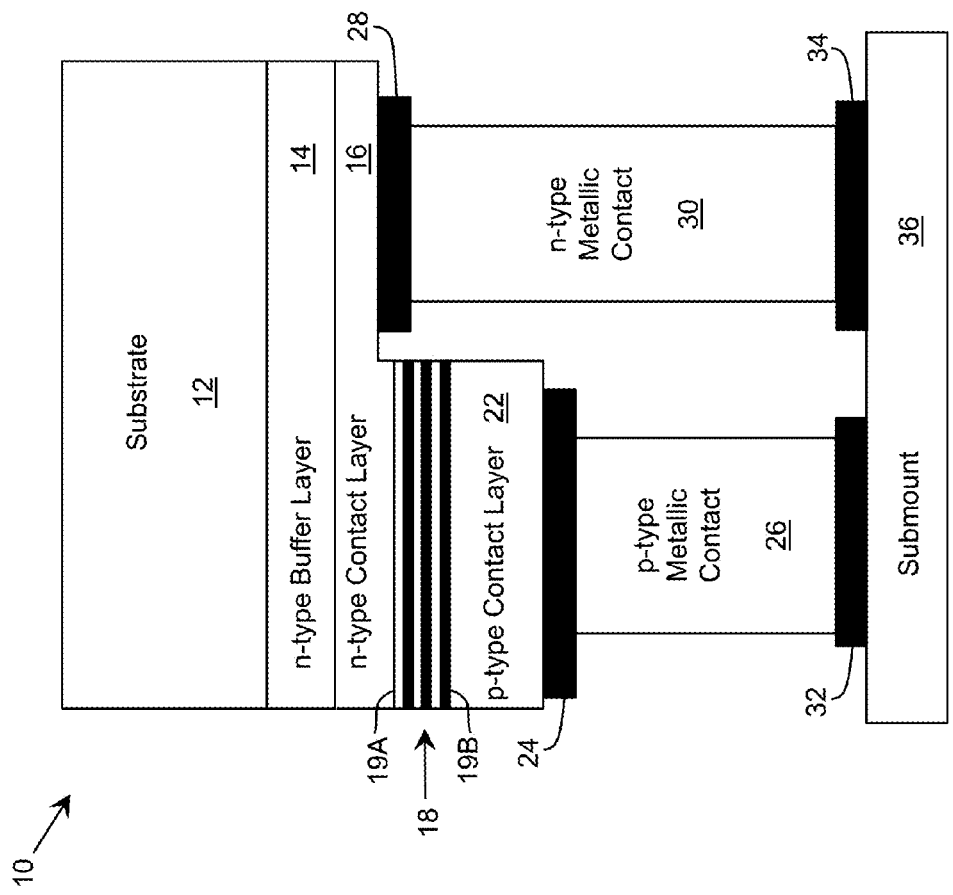
FIG. 1 shows a typical design of a flip-chip emitting device according to an embodiment.

Flip-chip technology is frequently utilized to control light extraction and thermal management of a LED, such as a deep ultraviolet (DUV) LED. Turning to the drawings, FIG. 1 shows a typical design of a flip-chip emitting device 10 according to an embodiment, while FIG. 2 shows a typical design of an emitting device 10 including a mesa structure according to an embodiment. In general, each emitting device 10 includes a semiconductor heterostructure having multiple semiconductor layers. Each semiconductor layer typically has lateral dimensions significantly larger than the layer height. Such a semiconductor layer is referred to herein as a planar layer and the discussion distinguishes between two directions: a direction in plane (e.g., extending right to left and into and out of the page in the drawing) and a direction perpendicular to the plane (e.g., extending top to bottom in the drawing). In a typical embodiment, the lateral dimensions of a layer can reach several square millimeters, whereas the height of the layer is typically measured in micrometers and nanometers. A planar area of the layer is typically referred to as the area of the layer or the area of the semiconductor structure. A lateral planar area is defined as an area of a surface of the semiconductor layer and is parallel to the surface of the substrate used for epitaxial growth.

As illustrated, each emitting device 10 includes a heterostructure comprising a substrate 12, a buffer layer 14 adjacent to the substrate 12, an n-type contact layer 16 (e.g., an electron supply layer) adjacent to the buffer layer 14, and an active region 18 having an n-type side 19A adjacent to the n-type cladding layer 16. Furthermore, the heterostructure of each emitting device 10 includes a p-type contact layer 22

(e.g., a hole supply layer) adjacent to a p-type side 19B of the active region 18. It is understood that the emitting devices 10 are only illustrative of various configurations of heterostructures. To this extent, a heterostructure can include one or more additional layers, which are not shown.

In a more particular illustrative embodiment, an emitting device 10 is a group III-V materials based device, in which some or all of the various layers are formed of elements selected from the group III-V materials system. In a still more particular illustrative embodiment, the various layers of the emitting device 10 are formed of group III nitride based materials. Group III nitride materials comprise one or more group III elements (e.g., boron (B), aluminum (Al), gallium (Ga), and indium (In)) and nitrogen (N), such that $B_W Al_X Ga_Y In_Z N$, where $0 \leq W, X, Y, Z \leq 1$, and $W+X+Y+Z=1$. Illustrative group III nitride materials include AlN, GaN, InN, BN, AlGaN, AlInN, AlBN, AlGaInN, AlGaBN, AlInBN, and AlGaInBN with any molar fraction of group III elements.

An illustrative embodiment of a group III nitride based emitting device 10 includes an active region 18 (e.g., a series of alternating quantum wells and barriers) composed of $In_y Al_x Ga_{1-x-y} N$, $Ga_z In_y Al_x B_{1-x-y-z} N$, an $Al_x Ga_{1-x} N$ semiconductor alloy, or the like. Similarly, both the n-type contact layer 16 and the p-type contact layer 22 can be composed of an $In_y Al_x Ga_{1-x-y} N$ alloy, a $Ga_z In_y Al_x B_{1-x-y-z} N$ alloy, or the like. The molar fractions given by x, y, and z can vary between the various layers 16, 18, and 22. The substrate 12 can be sapphire, silicon carbide (SiC), silicon (Si), GaN, AlGaN, AlON, $LiGaO_2$, or another suitable material, and the buffer layer 14 can be composed of AlN, an AlGaN/AlN superlattice, and/or the like.

A p-type metal 24 can be attached to the p-type contact layer 22 and a n-type metal 28 can be attached to the n-type contact layer 16. The p-type metal 24 and the n-type metal 28 can form ohmic contacts to the corresponding layers 22, 16, respectively. As shown with respect to the emitting device 10 of FIG. 1, a p-type metallic contact 26 can be attached to the p-type metal 24 and an n-type metallic contact 30 can be attached to the n-type metal 28. In an embodiment, the p-type metal 24 and the n-type metal 28 each comprise several conductive and reflective metal layers, while the n-type metallic contact 30 and the p-type metallic contact 26 each comprise highly conductive metal.

In an embodiment, an emitting device 10 includes one or more layers, such as the n-type contact layer 16 and/or the p-type contact layer 22, formed of a semiconductor structure having one or more inhomogeneous regions located therein. The inhomogeneous regions can include one or more regions configured based on radiation having a target wavelength and/or one or more regions configured based on a desired conductivity. To this extent, the inhomogeneous regions can include one or more of: a set of transparent regions, a set of reflective regions, and/or a set of conductive regions. As used herein, a region is a transparent region when the region allows at least ten percent of radiation having a target wavelength, which is radiated at a normal incidence to an interface of the region, to pass there through. Furthermore, as used herein, a region is a reflective region when the region reflects at least ten percent of radiation having a target wavelength, which is radiated at a normal incidence to an interface of the region. In an embodiment, the target wavelength of the radiation corresponds to a wavelength of radiation emitted or sensed by the active region 18 during operation of the device 10. For a given layer, the wavelength can be measured in a material of consideration and can depend on a refractive index of the material.

A conductive region can be configured to promote conductivity of carriers in the semiconductor structure. A conductive region can have a higher concentration of carriers due to, for example, a locally reduced band gap of the semiconductor layer, a local high doping of the semiconductor layer, and/or the like. In an illustrative embodiment, the conductive region is formed of a group III nitride semiconductor material. In this case, a high local level of doping can be achieved by locally reducing an aluminum content, by polarization doping resulting in graded layers, and/or the like. Regardless, the improved conductivity can maintain an overall conductivity of the semiconductor structure. In an embodiment, a conductive region has a conductivity at least ten percent higher than a conductivity of a transparent region and a conductivity of a reflective region and a higher conductivity than a base semiconductor material for the layer.

A conductive region described herein can be anisotropic in the layer normal and/or lateral directions. For example, one or more of the conductive regions can have a high conductivity in a layer normal direction but not in the layer lateral direction, while one or more other conductive regions can have a high conductivity in the layer lateral direction but not in the layer normal direction. The conductive regions with high conductivity in the layer normal direction are referred to as regions with vertical conductivity, while conductive regions with high conductivity in the layer lateral direction are referred to as regions with horizontal conductivity. Similar to an isotropic conductive region, an anisotropic conductive region can have a conductivity in the preferred semiconductor direction that is at least ten percent higher than a conductivity of the reflective and transparent regions in the preferred direction.

Regions of each type (transparent, reflective, and conductive) can be incorporated into the semiconductor structure (e.g., a layer in the emitting device 10) and have an area that is a fraction of the area of the entire semiconductor structure. In an embodiment, the area of the region is approximately a few percent of the area of the semiconductor structure or more (e.g., greater than or equal to approximately three percent of the area of the semiconductor structure). Additionally, a region can have a height that is smaller than a height of the corresponding semiconductor structure. For example, a region can have a height that is fifty percent or ten percent of the height of the semiconductor layer. A region can be located anywhere within the semiconductor structure, including completely within the semiconductor structure or located adjacent to either planar side of the semiconductor structure. In an embodiment, the semiconductor structure includes multiple regions of the same type, which can be located in various portions of the semiconductor structure and can be present at different levels along a height of the semiconductor structure. To this extent, two or more of the regions of the same type can at least partially overlap with one another. In an embodiment, regions of the same type occupy at least five percent of the volume of the semiconductor structure. In another embodiment, regions of the same type occupy at least five percent of the lateral planar area of the semiconductor structure.

A semiconductor structure can include regions of one or more types. When regions of multiple types are included, the regions of different types can be located anywhere within the semiconductor structure with respect to one another. For example, a transparent region can be located adjacent to a reflective region, a conductive region can be located adjacent to a transparent region and/or a reflective region, and/or the like. Additionally, a single region can comprise both a transparent region, by allowing at least ten percent of radiation of a target wavelength to pass there through, and a reflective region, by reflecting at least ten percent of the radiation.

Figure 3A:
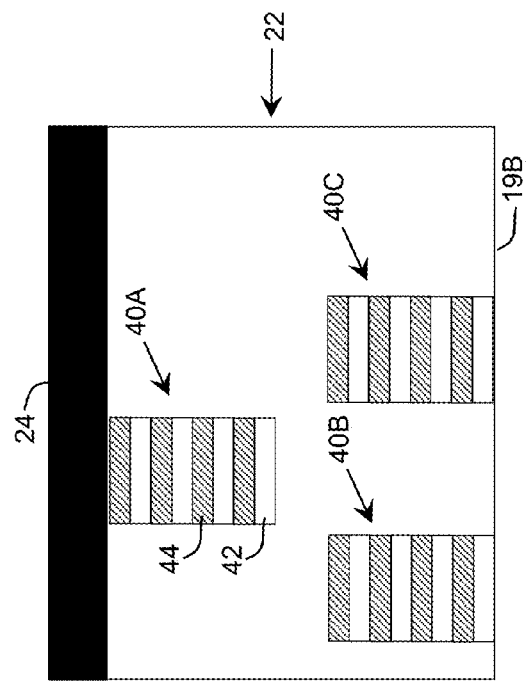
Figure 3B:
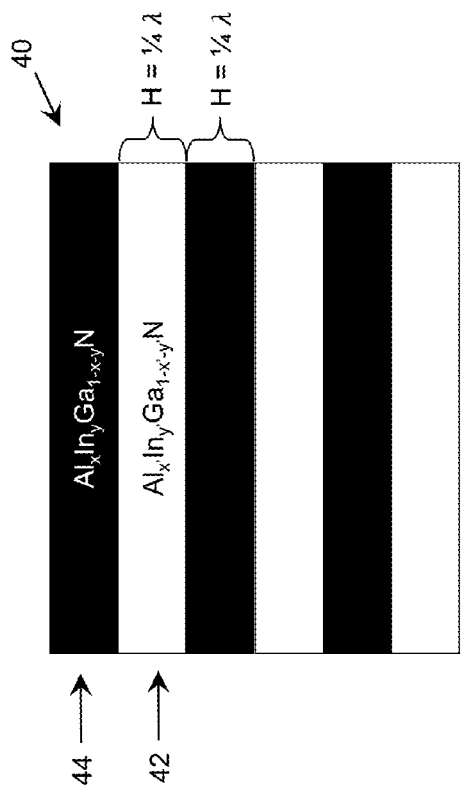
FIG. 3B shows an illustrative reflective region according to embodiments.

A reflective region can be formed of one or more composite mirrors. A composite mirror includes any structure having multiple sublayers of dielectric or metallic material. Such a composite mirror can be an omnidirectional mirror, which comprises a layer of material having a low index of refraction followed by a layer of material comprising a high index of refraction (e.g., a metallic reflector or a Bragg mirror). To this extent, FIG. 3A shows a layer including a plurality of reflective regions while FIG. 3B shows an illustrative reflective region according to embodiments. In FIG. 3A, the layer can correspond to a p-type contact layer 22, which is located adjacent to a p-type metal 24. However, it is understood that this is only illustrative. The p-type contact layer 22 is shown including three reflective regions 40A-40C located therein. As illustrated, each reflective region 40A-40C is located adjacent to a planar side of the p-type contact layer 22. However, it is understood that the number of and relative locations of the reflective regions 40A-40C are also only illustrative of various possible configurations.

As illustrated, a reflective region 40A-40C can be formed of a composite mirror having alternating sublayers of low index of refraction material 42 and relatively high index of refraction material 44 (e.g., a metallic reflector or a Bragg mirror). Furthermore, a sublayer of the reflective region 40A-40C closest to the p-type side 19B of the active region can be formed of a low index of refraction material 42. In an embodiment shown in FIG. 3B, a reflective region 40 (e.g., a Bragg mirror) can be epitaxially grown, and include a superlattice of group III nitride semiconductor sublayers 42, 44 of $Al_xIn_yGa_{1-x-y}N/Al_{x'}In_{y'}Ga_{1-x'-y'}N$, where x, y, x', and y' are chosen such that a refractive index of one sublayer is different from a refractive index of another sublayer by at least two percent (five percent in another embodiment). In a more particular embodiment, the refractive index of a group III nitride semiconductor alloy varies between values of 2.2 and 2.7 by adjusting a molar fraction of aluminum and/or indium. In an illustrative embodiment, x (the molar fraction of aluminum in one of the sublayers) is greater than 0.4. Only values with relatively high molar fractions are important in order to have Bragg mirrors with low absorption characteristics. Typical Bragg mirrors are designed to have alternative sublayers of low and high refractive index, with sublayer thicknesses being a quarter of a target wavelength ($\lambda$), wherein the target wavelength corresponds to a wavelength of radiation measured in the semiconductor material. In an embodiment, the Bragg mirror includes at least ten layers. In a more particular embodiment, each sublayer of low index of refraction material 42 can be at least 80% transparent to the target radiation.

In an embodiment, a semiconductor structure, such as the p-type contact layer 22, includes a sufficient number and configuration of reflective regions 40A-40C (e.g., Bragg mirrors) to provide at least a ten percent reflectivity for the entire semiconductor structure 22. In another embodiment, the reflective regions 40A-40C also can serve as transparent regions, which concurrently transmit and reflect at least ten percent of the radiation. In still another embodiment, such a transparent and reflective region can reflect at least twenty percent of radiation having a target wavelength at the normal direction to the region surface.

A reflective region 40 can be formed using another deposition solution, such as thermal evaporation, magnetron sputtering, ion-beam deposition, laser beam evaporation, and/or the like. A reflective region 40 formed using an alternative solution to epitaxial growth can utilize one or more of a larger selection of materials for the sublayers. For example, a reflective region 40 can include sublayers of a low index of refraction material, such as silicon dioxide ($SiO_2$), magnesium oxide (MgO), magnesium fluoride ($MgF_2$), and/or the like, and sublayers of a high index of refraction material such as aluminum oxide ($Al_2O_3$), scandium oxide ($Sc_2O_3$), magnesium aluminum oxide ($MgAl_2O_3$), and a group III nitride (e.g., AlN, $Al_xIn_yGa_{1-x-y}N$). As a result, a larger variability in the refractive indices of the sublayers is possible. For example, the refractive index of one sublayer can differ from the refractive index of another sublayer by at least three percent (ten percent in a more particular embodiment). In an embodiment, a sublayer with a low index of refraction can be deposited followed by deposition of a sublayer with a high index of refraction, e.g., either a metallic reflector or a Bragg mirror. In another embodiment, the sublayer with the high index of refraction can include aluminum nanoparticles in the low index of refraction material. Similar to Bragg mirrors grown epitaxially, a thickness of each sublayer can be chosen to provide good reflectance. For example, a thickness of each sublayer can be a quarter of a target wavelength, where the target wavelength is the wavelength of the radiation measured in the sublayer material.

A semiconductor structure (e.g., the p-type contact layer 22) including transparent, reflective, and/or conductive regions can be fabricated using patterning. For example, an initial group III nitride semiconductor layer can be epitaxially grown on a surface, followed by deposition of transparent, reflective, and/or conductive (vertically and/or horizontally) region(s) over the semiconductor layer by means of thermal evaporation, magnetron sputtering, ion-beam deposition, laser beam evaporation, and/or the like. Alternatively, one or more of the regions can be epitaxially grown above the group III nitride semiconductor layer. The deposited region(s) can be patterned, e.g., using photolithography, which includes depositing a photoresist, exposing patterned areas to high intensity light, and etching the exposed areas. Some portions of the deposited region(s) can be etched, and a group III nitride semiconductor layer is overgrown in the etched regions. The process of patterning can be repeated, again depositing a next layer of transparent, reflective, and/or conductive region(s). More complicated deposition and patterning are also possible, which can result in various arrangements of transparent, reflective, and/or conductive regions. For example, after etching portions of the deposited region(s), a second set of region(s) of a different type can be deposited in the etched regions (e.g., to form laterally adjacent regions of different types).

Figure 4:
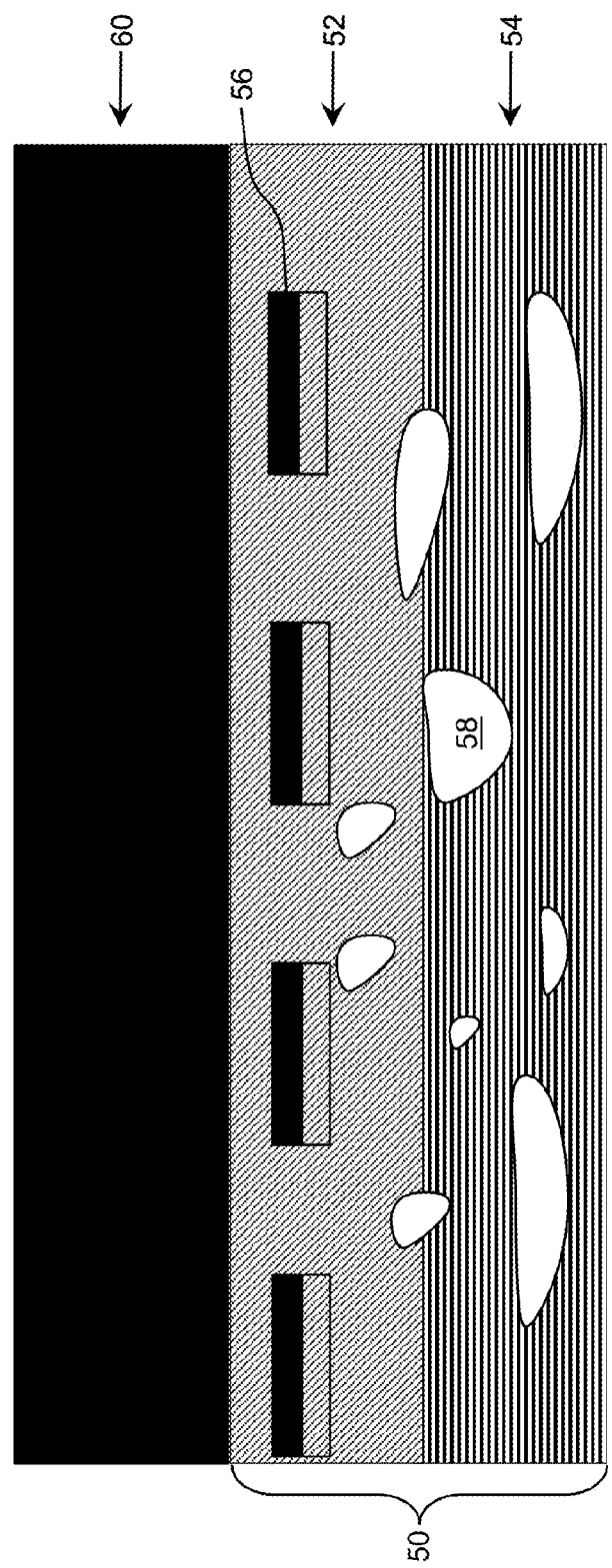
FIG. 4 shows an illustrative semiconductor structure according to an embodiment.

FIG. 4 shows an illustrative semiconductor structure 50 according to an embodiment. The semiconductor structure 50 includes a vertically conductive region 52 and a background base semiconductor structure 54 and is located adjacent to a metallic contact 60. In an embodiment, the background base semiconductor structure 54 comprises a group III nitride semiconductor layer, a structure composed of group III nitride semiconductor layers, or the like. In a more particular embodiment, the background base semiconductor structure 54 comprises a superlattice comprising $Al_xIn_yGa_{1-x-y}N/Al_{x'}In_{y'}Ga_{1-x'-y'}N$ sublayers. In this case, the superlattice can have an enhanced horizontal conductivity. The semiconductor structure 50 further includes reflective regions 56 (e.g., composite mirrors) and transparent regions 58. As illustrated, the transparent regions 58 can be located at several different levels within the semiconductor structure 50. Similarly, while not shown in FIG. 4, the reflective regions 56 can be located at different levels. A size of the regions 56, 58 can vary, e.g., based on a method utilized for fabricating such regions 56, 58. For example, regions 56, 58 formed using epitaxial growth can be ten to one thousand nanometers, whereas regions 56, 58 produced through patterning can result in a region size of several micrometers or larger.

In an embodiment, a semiconductor structure can include transparent regions and reflective regions interspersed with vertically conductive regions such that any lateral cross section of the semiconductor structure contains at least one transparent or reflective region and at least one vertically conductive region. For example, the semiconductor structure 50 can include a sufficient number of reflective regions 56 and transparent regions 58 arranged in conjunction with the vertically conductive region 52 to meet such a condition. Still further, an illustrative arrangement of regions can include regions of two or more types laterally adjacent to one another (e.g., joined). For example, a semiconductor structure can include an arrangement in which transparent or reflective regions are laterally adjacent to vertically conductive regions.

Figure 5:
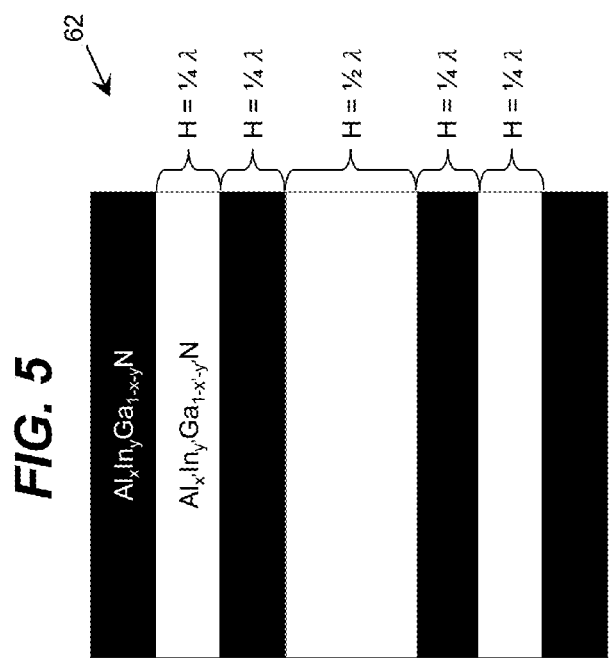
FIG. 5 shows a structure for an illustrative Fabry-Perot interference filter according to an embodiment.

In an embodiment, a transparent region, such as one or more of the transparent regions 58, comprises an $Al_xIn_yGa_{1-x-y}N/Al_{x'}In_{y'}Ga_{1-x'-y'}N$ superlattice with x, y, x' and y' chosen such that the transparency of the superlattice is at least ten percent for a target wavelength of radiation. In another embodiment, the transparent region can be configured to form a Fabry-Perot interference filter for a target wavelength of radiation. For example, FIG. 5 shows a structure for an illustrative Fabry-Perot interference filter 62 according to an embodiment. In this case, the filter 62 comprises a superlattice including a series of alternating layers of $Al_xIn_yGa_{1-x-y}N/Al_{x'}In_{y'}Ga_{1-x'-y'}N$, where x and x' molar fractions are larger than 0.35. The molar fractions x, x' are chosen to improve a transparency of the layers within the superlattice to radiation having a target wavelength. In an embodiment, y and y' are both zero (i.e., the layers do not include indium). Each layer in the superlattice has a thickness of approximately one quarter the target wavelength ($\lambda$), except for a middle layer having a thickness of approximately one half the target wavelength. In this manner, the filter 62 only transmits radiation having the target wavelength. In another embodiment, the transparent region 58 includes aluminum oxide ($Al_2O_3$), fused silica, aluminum nitride, or the like which can be deposited by means of thermal evaporation, magnetron sputtering, ion-beam deposition, or laser beam evaporation, and/or the like.

Figure 6:
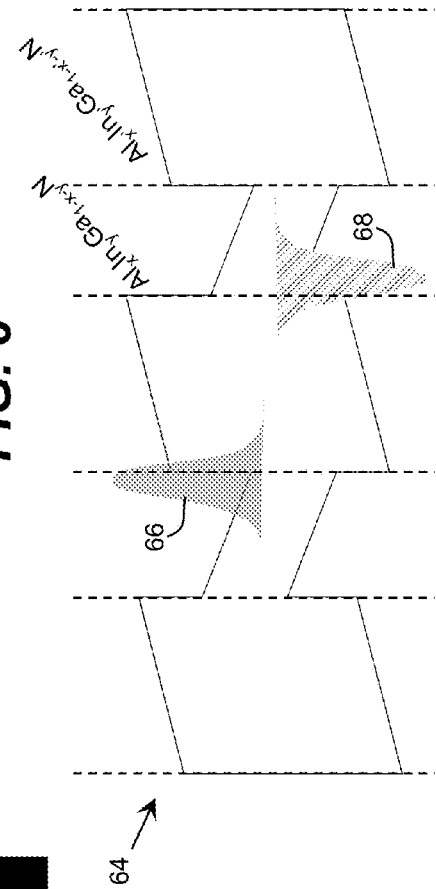
FIG. 6 shows a band diagram of an illustrative embodiment of a horizontally conductive material according to an embodiment.

As discussed herein, a semiconductor structure can include a material having an enhanced horizontal conductivity (e.g., the background base semiconductor structure 54 of FIG. 4). FIG. 6 shows a band diagram 64 of an illustrative embodiment of a horizontally conductive material according to an embodiment. In this case, the material comprises an $Al_xIn_yGa_{1-x-y}N/Al_{x'}In_{y'}Ga_{1-x'-y'}N$ superlattice having barriers and quantum wells alternating along a height of the material. Regions 66 and 68 correspond to localized concentration of electrons and holes, respectively, and result in the formation of two dimensional carrier gases. In particular, region 66 results in the formation of a two dimensional electron gas (2DEG), while region 68 results in the formation of a two dimensional hole gas (2DHG). The carrier gases have a high mobility in the lateral direction, which results in a horizontally conductive layer. In general, higher changes in band gap produce larger polarization fields, which can lead to an increase concentration of the carrier gases. In an illustrative example, a superlattice including layers of $GaN/Al_{0.3}Ga_{0.7}N$ provides a horizontally conductive material superlattice. In another embodiment, more than a two percent change in band gap is desired for formation of 2DEG.

Figure 7A:
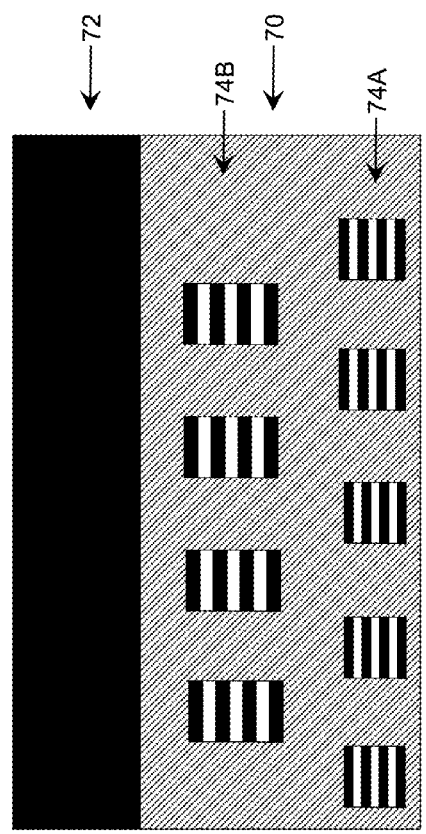
Figure 7B:
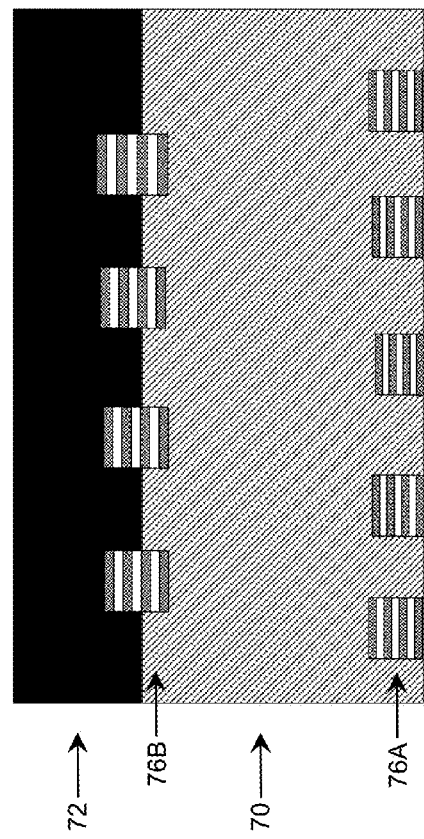

As discussed herein, regions of any of the types (e.g., reflective, transparent, or conductive), can be located in various arrangements within a semiconductor structure. To this extent, FIGS. 7A-7C show illustrative arrangements of reflective regions according to embodiments. In FIG. 7A, a semiconductor base layer 70 is located adjacent to a metal contact 72 and includes two levels 74A, 74B of reflective regions. Each level 74A, 74B of reflective regions is immersed in the semiconductor base layer 70. Additionally, reflective regions located in level 74B are laterally offset (staggered) from reflective regions located in level 74A. FIG. 7C shows a top view of an embodiment in which the levels 74A, 74B of reflective regions can be staggered in a manner that forms a checkerboard arrangement. In FIG. 7B, a first level 76A of reflective regions is located adjacent to an interface of the semiconductor base layer 70, while a second level 76B of reflective regions penetrates the metal contact 72. It is understood that these arrangements are only illustrative of various possible arrangements of regions.

FIGS. 8A and 8B show illustrative reflective regions 80A, 80B comprising omnidirectional mirrors according to embodiments. The mirror for each reflective region 80A, 80B comprises a low refractive index layer 82 located within a contact layer, such as the p-type contact layer 22. For example, the low refractive index layer 82 can have a refractive index at least ten percent lower than the refractive index of the corresponding contact layer 22. Additionally, each reflective region 80A, 80B comprises a highly reflective layer 84 located adjacent to an opposite side of the low refractive index layer 82 as the active region 18. Reflective region 80B further includes a distributed dielectric mirror 86 located between the low refractive index layer 82 and the highly reflective layer 84. The reflective regions 80A, 80B can further include a set of conductive regions 88, each of which can extend from the contact layer 22 to the highly reflective layer 84 thereby forming a passage through the low refractive index layer 82. The conductive regions 88 can comprise metallic or other conductive material regions. In an embodiment, the conductive regions 88 can be fabricated by etching the low refractive index layer 82 and distributed dielectric mirror 86 to access the contact layer 22 located underneath.

A semiconductor structure can include any combination and/or arrangement of the various types of regions, which can be selected based on a set of performance requirements for the semiconductor structure and/or the corresponding device. In an embodiment, the semiconductor structure can include vertically and horizontally conductive regions arranged to form an interconnected network of conductive paths through the semiconductor structure. The term "interconnected" network does not necessarily imply that all the conductive regions form a single network. As used herein, the term is applied loosely and includes clusters of overlapping conductive regions disconnected by gaps. In an embodiment, a typical cluster size and cluster density is chosen to match a conductivity requirement of the semiconductor structure. For example, for a semiconductor structure formed adjacent to a p-type contact, the cluster density and cluster size can be chosen to provide such conductivity of the p-type contact that a voltage drop across the p-type contact is ten percent or less than a voltage drop across the entire device.

As discussed herein, an embodiment of the semiconductor structure can be included in an optoelectronic device, such as a light emitting diode, a deep ultraviolet light emitting diode, a light sensor, other types of optoelectronic solid state devices, and/or the like. In a more specific embodiment, the semiconductor structure is incorporated in such a device to improve light extraction characteristics of the corresponding device. Returning to FIGS. 1 and 2, a semiconductor structure described herein can be incorporated as some or all of the p-type contact layer 22 and/or n-type contact layer 16.

In an embodiment of the device 10 shown in FIG. 1 or FIG. 2, a metallic contact 24 and/or a metallic contact 28 can comprise a multilayered structure. For example, the metallic contact 24, 28 can include an ohmic layer adjacent to the corresponding contact layer 22, 16, respectively, followed by a reflective layer located adjacent to the ohmic layer. The ohmic layer can be transparent to radiation having a target wavelength as described herein, while the reflective layer can be reflective to radiation having the target wavelength. In a more specific embodiment, the ohmic layer allows at least twenty percent of radiation having a target wavelength, which is radiated at a normal incidence to an interface of the ohmic layer, to pass there through. In another more specific embodiment, the reflective layer reflects at least fifty percent of radiation having the target wavelength, which is radiated at a normal incidence to an interface of the reflective layer. In an embodiment, the target wavelength corresponds to ultraviolet light, e.g., within a range of wavelengths between approximately 260 and approximately 360 nanometers.

A metallic contact 24 and/or a metallic contact 28 can include one or more additional layers, e.g., to improve stability, reflectivity, and/or conductive properties of the ohmic contact. For example, FIG. 9 shows an illustrative multilayered metallic contact 90 according to an embodiment. In this case, the contact 90 includes an ohmic layer 92, an ohmic protective layer 94, a reflective layer 96, a reflective protective layer 98, and a conductive metallic layer 100. Each layer 92, 94, 96, 98, 100 can be formed of any suitable material and can be fabricated using any solution. For example, the ohmic contact layer 92 can be one of: cobalt (Co), nickel (Ni), palladium (Pd), iron (Fe), platinum (Pt), or the like. Additionally, the ohmic contact layer 92 can include one or sub-layers of metals. Such a sub-layer can include the above metals as well as: Pd, rhodium (Rh), ruthenium (Ru), osmium (Os), iridium (Ir), thorium (Th), and boron (B), and can incorporate one or more of: calcium (Ca), magnesium (Mg), beryllium (Be), manganese (Mn), or tin (Sn), with a maximum concentration up to approximately $10^{21}$ cm$^{-3}$. For example, the ohmic layer 92 can include: a sub-layer of Co/Mg/Ni having a thickness of approximately one to two nanometers, which can act as an adhesive; a two to five nanometer sub-layer of palladium, which can provide a good ohmic contact; and a sub-layer of rhodium having a thickness of approximately 150 Angstroms. The ohmic protective layer 94 can comprise: Pt, rhenium (Re), Pd, Rh, Ru, Os, Ir, or the like; an oxide, such as indium tin oxide (ITO), zinc oxide (ZnO), or the like; and/or the like. The ohmic protective layer 94 can be as thick as few tens of nanometers. The reflective layer 96 can comprise Al, and be relatively thick (e.g., as much as a few hundred nanometers). A reflective protective layer 98 can comprise titanium (Ti), zirconium (Zr), hafnium (Hf), molybdenum (Mo), tungsten (W), Pd, Rh, Ru, Os, Ir, vanadium (V), chromium (Cr), Pt, or their allows. A conductive metallic layer 100 can comprise a layer of any type of material having a high electrical conductivity, including copper (Cu), silver (Ag), gold (Au), nickel (Ni), or their alloys.

An ohmic layer and/or reflective layer of a metallic contact 24 and/or a metallic contact 28 can be discontinuous. For example, a layer can comprise a plurality of island formations. The island formations can have a characteristic size of between ten to two thousand nanometers (up to one hundred thousand nanometers in another embodiment) and can be separated from one another by a characteristic distance of approximately the same order as the characteristic size of the islands. In an embodiment, the ohmic and reflective islands are interspersed with each other. Similarly, a semiconductor layer located adjacent to a metallic contact 24 and/or a metallic contact 28 can have a laterally inhomogeneous structure.

For example, FIG. 10 shows an illustrative interface between a semiconductor layer 102 and a metallic contact 110 according to an embodiment. The semiconductor layer 102 is shown including laterally adjacent regions 104, 106, which can have distinct properties. In an embodiment, a first set of regions 104 comprise conductive regions, while a second set of regions 106 comprise transparent or reflective regions. The metallic contact 110 is shown having an ohmic layer formed of a plurality of ohmic islands 112A-112F, over which a reflective layer 114 can be located. The ohmic islands 112A-112F can be randomly located or patterned. Furthermore, an alignment of the ohmic islands 112A-112F with respect to the regions 104, 106 of the semiconductor layer 102 can be random or predetermined. In the latter case, any solution can be utilized for the alignment including for example, semiconductor layer patterning and overgrowth, ohmic layer patterning, and/or the like. As illustrated, a characteristic distance D between the ohmic islands 112A-112F can be comparable to a characteristic lateral size of the ohmic islands 112A-112F.

Figure 11C:
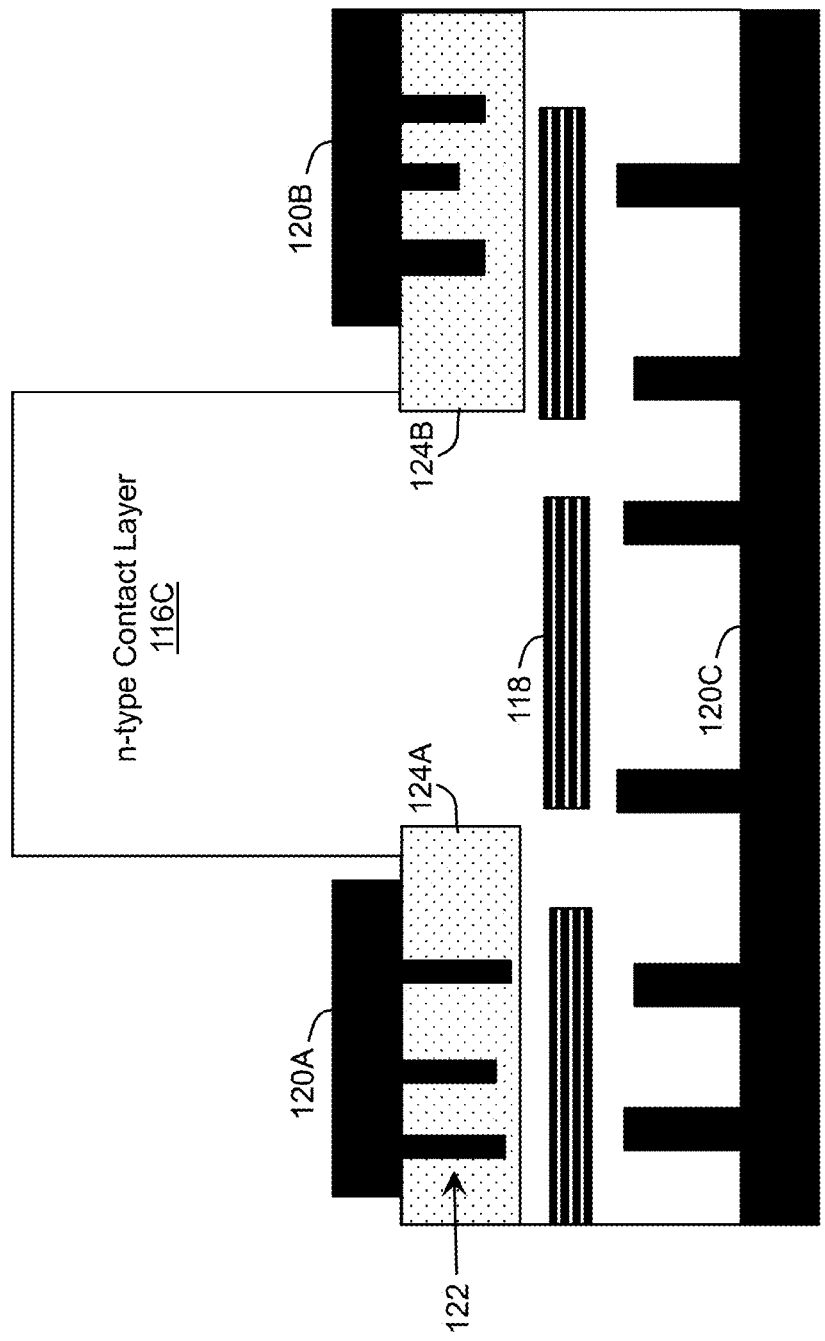

FIGS. 11A-11C show illustrative n-type contact layers 116A-116C, respectively, including reflective regions 118 according to embodiments. The reflective regions 118 can comprise, for example, superlattices of $Al_xIn_yGa_{1-x-y}N/Al_{x'}In_{y'}Ga_{1-x'-y'}N$ layers, which can be grown epitaxially. Since the n-type contact layers 116A, 116B can have thicknesses of several microns, relatively thick composite reflective regions 118 can be utilized which can lead to a higher degree of reflection. As illustrated in FIG. 11A, inclusion of the reflective regions 118 in the n-type contact layer 116A can provide a more efficient reflection of radiation towards the p-type contact 24. For an efficient extraction of radiation from the device 111, the p-type contact 24 and the p-type contact layer 22 should be transparent to the radiation generated by the active region 18 (e.g., transmitting at least thirty percent of the radiation of a target wavelength in an embodiment).

As shown in FIGS. 11B and 11C, a n-type metal contact 120A-120C can include metallic protrusions 122 extending into the n-type contact layer 116B, 116C. Furthermore, as shown in FIG. 11C, a n-type contact layer 116C can include conductive regions 124A, 124B having high horizontal conductivity in a location of the protrusions 122. The protrusions 122 can deliver the current to the horizontally conductive regions 124A, 124B, which can spread the current horizontally to other regions having a high vertical conductivity (e.g., the background base semiconductor structure of the n-type contact layer 116C). Furthermore, a n-type metal contact, such as the metal contact 120C, can be adjacent to region(s) of high vertical conductivity. The metal contact 120C provides a vertical design for the n-type contact structure and can be included alone or in combination with the horizontal designed metal contacts 120A, 120B. In an embodiment, the metal contact 120C is formed by removing a substrate used for epitaxial growth of the semiconductor layer(s) and depositing the n-type metal contact 120C on the exposed surface of the semiconductor layer.

Figure 12:
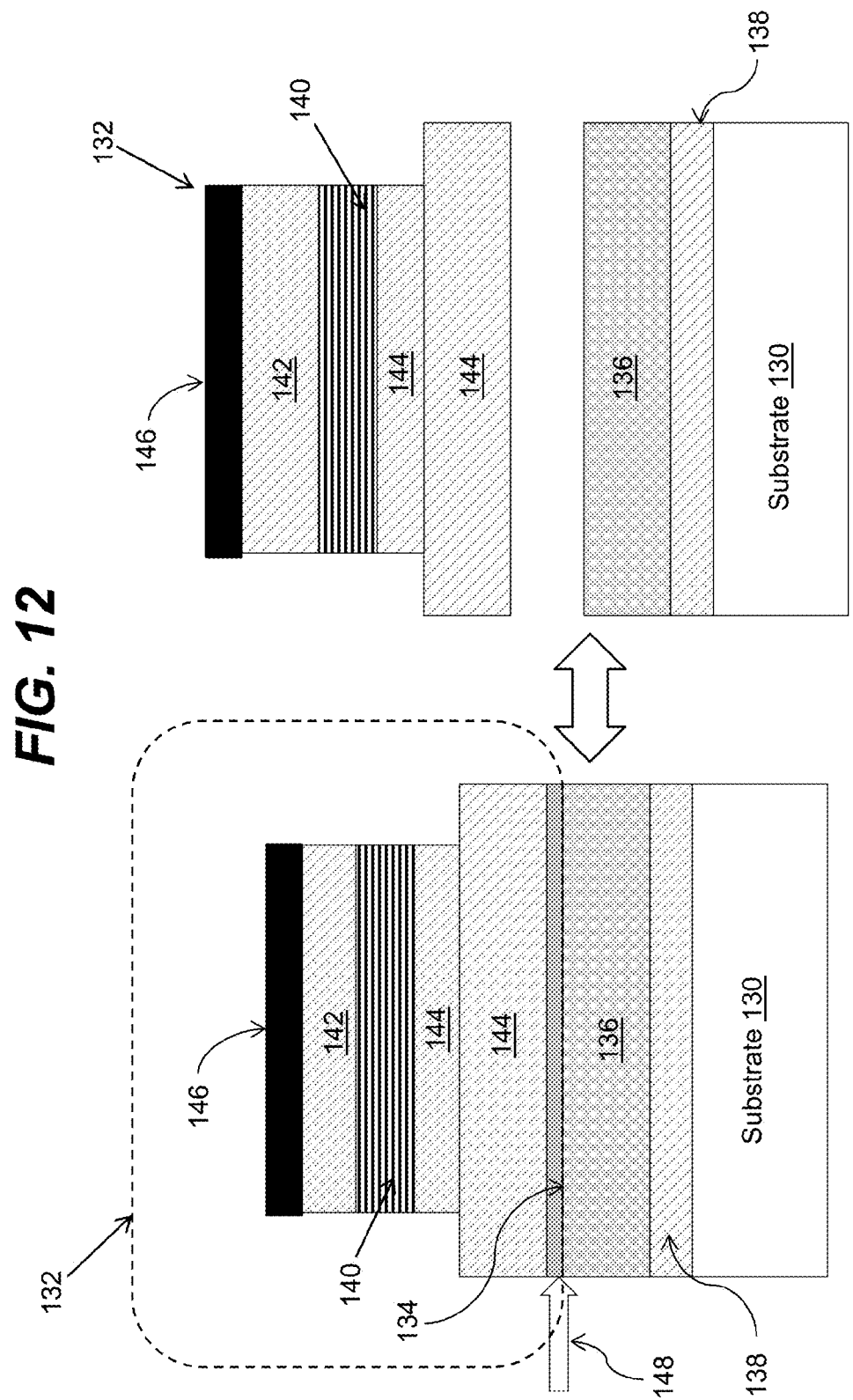
FIG. 12 shows a schematic of a laser lift-off method to lift a semiconductor structure such as any of the structures described herein from a substrate according to an embodiment.

Any of the semiconductor structures described herein, as well as other structures that include any of the concepts of the various embodiments described herein can be incorporated into an optoelectronic device such as one of those devices listed above. FIG. 12 shows a schematic of a laser lift-off method to lift a semiconductor structure, such as any of the structures described herein, from a substrate 130 according to an embodiment. As shown on the left-hand side of FIG. 12, a semiconductor heterostructure 132 can be formed on the substrate 130 via a sacrificial layer 134, a semiconductor layer 136 and a buffer layer 138.

The semiconductor heterostructure 132 can include an active region 140, a p-type contact layer 142 located on a first side of the active region 140, and a n-type contact layer 144 located on a second side of the active region 140 opposite the first side. A p-type metal layer 146 can be formed on the p-type contact layer 142. Any of the aforementioned materials are suitable for use with the active region 140, the p-type contact layer 142, the n-type contact layer 144 and the p-type metal layer 146. A semiconductor heterostructure formed from group III nitride layers is one example of materials that can be used since these layers can grow over the substrate 130, the sacrificial layer 134, the semiconductor layer 136 and the buffer layer 138.

Although not shown in FIG. 12, either one or both of the p-type contact layer 142 and the n-type contact layer 144 can include a group III nitride semiconductor layer having a plurality of inhomogeneous regions that can take the form of any of the previously described embodiments. In this manner, each inhomogeneous region in either the p-type contact layer 142 and the n-type contact layer 144 can have a set of attributes that differ from the group III nitride material forming the semiconductor layer. In one embodiment, the plurality of inhomogeneous regions can include a set of first inhomogeneous regions configured based on radiation having a target wavelength, wherein the set of first inhomogeneous regions are at least one of: transparent to the radiation or reflective of the radiation: The plurality of inhomogeneous regions can further include a set of second inhomogeneous regions having a conductivity that is at least ten percent higher than a conductivity of the set of first inhomogeneous regions. Each of the sets of inhomogeneous regions can occupy at least five percent of at least one of: a lateral planar area of the semiconductor layer or a volume of the semiconductor layer. In one embodiment, at least some of the sets of inhomogeneous regions do not fully overlap with each other.

The substrate 130 can include any substrate that is well-known for growing semiconductor layers thereon. One example of a substrate can include sapphire, but other substrates are possible. The buffer layer 138 can be a semiconductor layer that provides some separation from the semiconductor heterostructure 132. The buffer layer 138 can include, but is not limited to, aluminum nitride or gallium nitride. In some embodiments, the buffer layer 138 can comprise an $Al_xGa_{1-x}N$ layer, with x>0.8.

The semiconductor layer 136 can serve to improve the subsequent heterostructure by reducing the number of dislocations present in the heterostructure. In an embodiment, the semiconductor layer 136 comprises an AlN layer grown under conditions allowing for reduction of dislocations. For example, the semiconductor layer 136 can be grown to have a variable V/III ratio or a presence of one or more AlGaN interlayers. In other cases, the semiconductor layer 136 can contain an $Al_xGa_{1-x}N/Al_yGa_{1-y}N$ superlattice, in which x and y differ by at least 5%. In one embodiment, the semiconductor layer 136 can include $Al_xIn_yB_zGa_{1-x-y-z}N$. For an embodiment in which an optoelectronic device is an ultraviolet light emitting diode, for which the described technology is preferential, the semiconductor layer 136 can include AlN having a thickness that is chosen to minimize the number of dislocations in subsequent layers. In one embodiment, a typical thickness for a semiconductor layer 136 including AlN can range from about 1 micrometers to about 10 micrometers.

The sacrificial layer 134 can include a material that is capable of being grown over the semiconductor heterostructure 132 with the semiconductor layer 136, the buffer layer 138 and the substrate layer 130 coupled thereto. In one embodiment, the sacrificial layer 134 can be suitable for use in lift-off techniques where the semiconductor heterostructure 132 is removed from the substrate 130, including the sacrificial layer 134, the semiconductor layer 136, and the buffer layer 138, using laser radiation and subsequent fabrication of an optoelectronic device. In one embodiment, the sacrificial layer 134 can include a group III nitride semiconductor layer with a bandgap value that is lower than the bandgap value of any layer in the semiconductor heterostructure 132. For example, the sacrificial layer 134 can include GaN. In another embodiment, the sacrificial layer 134 can include columnar structures comprising group III nitride semiconductors epitaxially grown over a masked region that has holes or openings for growing sacrificial layer material. For example, the sacrificial layer 134 can include alternating GaN/AlN layers of $Al_xGa_{1-x}N/Al_yGa_{1-y}N$ layers having a difference between molar fractions of x and y that is at least 0.1 and preferably greater than 0.5. In one embodiment, the sacrificial layer 134 can include a large number of compositional lateral fluctuations. For example, the sacrificial layer 134 can include compositional fluctuations in $Al_xIn_yGa_{1-x-y}N$ alloy with fluctuations both in aluminum and indium molar fractions. In another embodiment, the sacrificial layer 134 can include a semiconductor layer containing holes, vacancies, or a set of disjoint columnar structures. In one embodiment, the sacrificial layer 134 can include combinations of any of the aforementioned sacrificial layers. Also, the sacrificial layer 134 can include tensile and compressive layers The thickness of the sacrificial layer 134 can be selected to result in maximum stresses and strains within the layer without significantly altering the number of dislocations within the layer. In one embodiment, the thickness of the sacrificial layer 134 can range from about 10 nanometers (nm) to about 500 nanometers (nm). The exact optimal thickness of the sacrificial layer 134 can be determined by growing the sacrificial layer with different thicknesses and determining the limiting thickness that leads to the onset of dislocations. In one embodiment, the optimal thickness of the sacrificial layer 134 can be selected to be about 10% lower than the maximum allowable thickness before the onset of dislocations. U.S. Provisional Application 62/187, 707, entitled "A method of releasing group III nitride semiconductor heterostructure," which was filed on 1 Jul. 2015 provides further details of a sacrificial layer and is incorporated herein by reference.

In one embodiment, the semiconductor heterostructure 132 can be separated from the substrate 130 by irradiating the semiconductor layers that can form the heterostructure from the substrate side to decompose the sacrificial layer, thus separating the semiconductor heterostructure 132 from the substrate 130, the semiconductor layer 136 and the buffer layer 138. A laser lift-off is one example of a laser radiation technique that can be used to lift semiconductor layers such as a semiconductor heterostructure from a substrate. A laser lift-off is a well-known technique in the art that is used to separate semiconductor layers from a substrate, which can result in improved characteristics of a subsequently fabricated optoelectronic device. U.S. Provisional Application 62/187,707 provides further details of several laser-lift off techniques that can be used to irradiate group III nitride semiconductor layers from the substrate side to decompose a sacrificial layer. As shown in the right-hand side of FIG. 12, the semiconductor heterostructure 132 is lifted off the substrate 130, the semiconductor layer 136 and the buffer layer 138 upon the application of a laser emission 148 (left-hand side of FIG. 12). In particular, the laser emission at a specified wavelength is absorbed by the sacrificial layer 134, causing it to decompose, separating the semiconductor heterostructure 132 from the substrate 130.

Figure 13A:
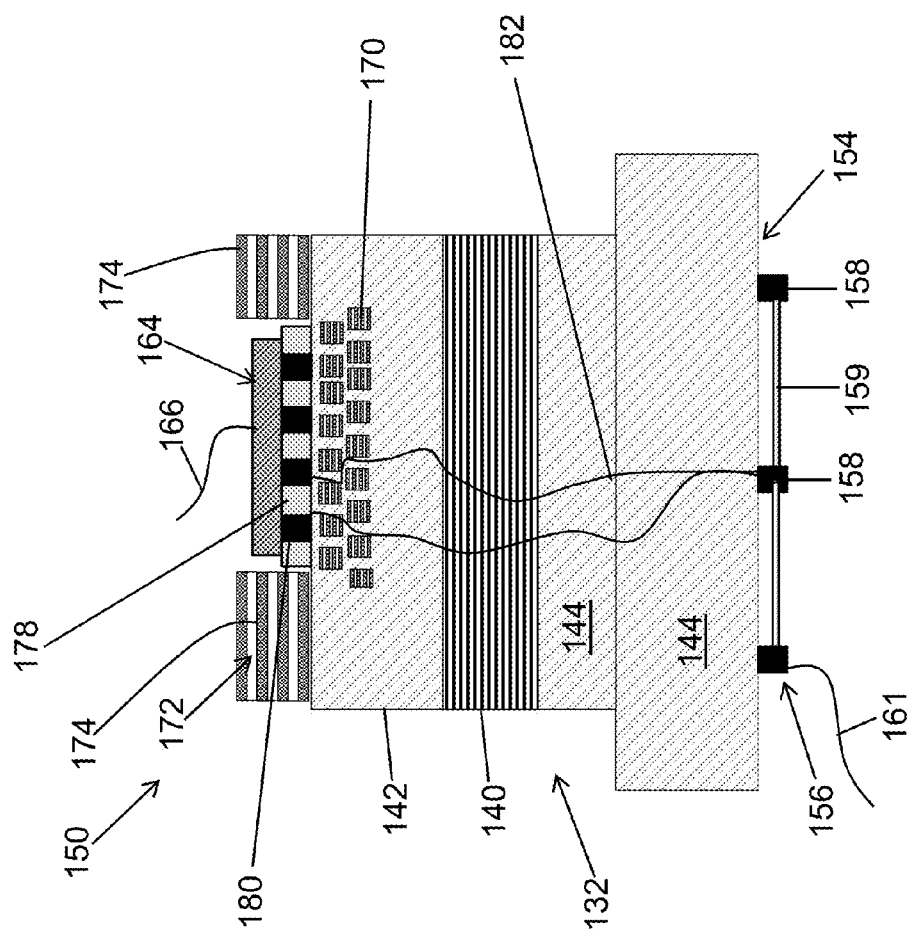
FIGS. 13A-13C show multiple views of an optoelectronic device formed from a semiconductor heterostructure lifted off from a substrate according to an embodiment.
Figure 13B:
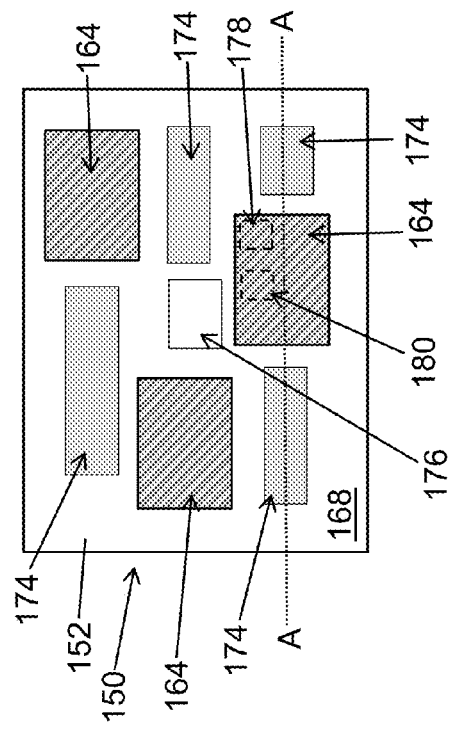
Figure 13C:
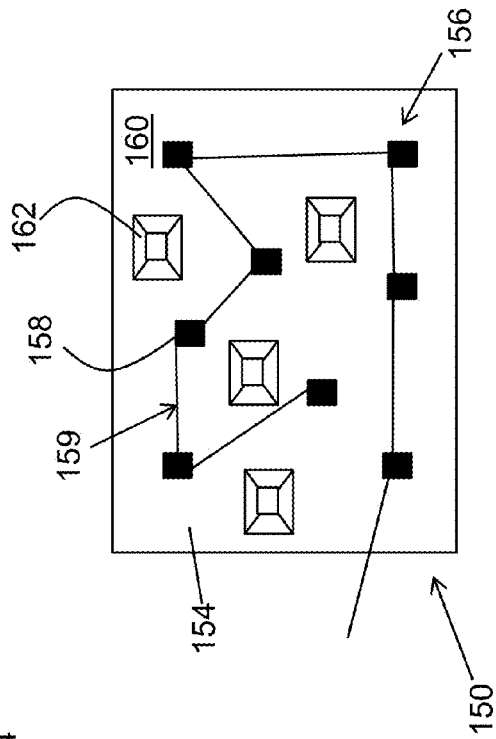

FIGS. 13A-13C show multiple views of an optoelectronic device 150 formed from the semiconductor heterostructure 132 depicted in FIG. 12 after a laser lifted off from the substrate 130 according to an embodiment. In particular, FIG. 13A shows a cross-sectional view of the optoelectronic device 150 taken from a cut line AA in FIG. 13B, which shows a top plan view of a top surface 152 of the optoelectronic device 150, while FIG. 13C shows a bottom plan view of a bottom surface 154 of the optoelectronic device 150.

As shown in FIGS. 13A and 13C, the bottom surface 154 of the optoelectronic device 150 can have a metallic n-type contact 156 having a plurality of metallic domains 158 connected by electrical contacts 159. In particular, the metallic n-type contact 156 and connected metallic domains 158 can be formed on a first side 160 of the n-type contact layer 144 with an electrical contact 161, such as an n-type electrical contact, coupled to the metallic n-type contact 156. The metallic n-type contact 156 and connected metallic domains 158 can serve to conduct electrical current through the device 150 and/or scatter or reflect the light generated by the device 150. In one embodiment, the metallic n-type contact 156 and connected metallic domains 158 can be made from materials that can include, but are not limited to, titanium, nickel, chromium, a combination of two or more of the materials, and/or the like. It is noted that the electrical contacts 159 that connect the metallic domains 158 can be made sufficiently thin to not pose a significant obstruction to the emitted light from the optoelectronic device 150. The metallic domains 158, which can be n-type domains, can also cover a small fraction of the area of the first side 160 of the metallic n-type contact 156 as not to pose a significant obstruction to the emitted light.

FIG. 13C also shows that the bottom surface 154 of the optoelectronic device 150 can have roughness elements 162 to improve light extraction from the device. In particular, the roughness elements 162 are interspersed with the metallic domains 158 of the metallic n-type contact 156. The roughness elements can include, but are not limited to, protrusions within the substrate, externally deposited roughness elements comprising shapes of $Al_2O_3$ or $SiO_2$, and/or the like.

As shown in FIGS. 13A and 13B, the top surface 152 of the optoelectronic device 150 can have metallic contact domains 164 formed thereon with an electrical contact 166 coupled thereto. In one embodiment, the metallic contact domains 164 can be p-type metallic contact domains that are formed on a side 168 of the p-type contact layer 142, and the electrical contact 166 can be a p-type electrical contact. As shown in FIG. 13B, the metallic contact domains 164 can be located on various locations throughout the side 168 of the p-type contact layer 142. Each of these metallic contact domains 164 can coupled to an electrical contact 166. In one embodiment, the p-type metallic contact domains 164 can be made from materials that can include, but are not limited to, nickel, rhodium, palladium, aluminum, and/or the like. In an embodiment, a metallic contact domain 164 comprises a multi-layer metallic structure with the first metallic layer being nickel. The electrical contact 166, which as noted above can be a p-type electrical contact, can be made from materials that can include, but are not limited to, UV reflective material, aluminum, rhodium or other conductive and partially UV reflective metal, and/or the like.

The optoelectronic device 150 can also include UV reflective elements 170 that can protect the p-type contact layer electrical contact 166 by preventing emitted UV radiation from being absorbed by the p-type contact layer electrical contact 166. In one embodiment, the reflective elements 170 can be incorporated or embedded within the p-type contact layer 142. In one embodiment, the reflective elements 170 can be incorporated in multiple levels of the p-type contact layer 142. As shown in FIG. 13A, the reflective elements 170 in each level can be staggered with reflective elements in an adjacent level such that there is an offset in position between elements in the different levels. It is understood that the two levels depicted in FIG. 13A are illustrative of one example, and that it is possible to have more levels, or only one level.

The reflective elements 170 can include, but are not limited to, a dielectric, metallic reflective islands, Bragg mirrors, omnidirectional reflectors such as combination of metallic and dielectric films, and combinations thereof. In an embodiment where the reflective elements 170 are formed from Bragg mirrors, these elements can include alternating layers of dielectric with at least one of the layers being $Hf_2O_3$. In another embodiment, the Bragg mirrors can be formed from alternating layers of one of $Hf_2O_3$ and $Al_2O_3$, $H_2O_3$ and $SiO_2$, and $Al_2O_3$ and $SiO_2$. The alternating layers of $H_2O_3$ and $SiO_2$ can have the highest contrast in the index of refraction, and thus, can provide the best reflection. These types of Bragg mirrors can be obtained by depositing alternative sequences of the dielectric material with subsequent patterning. It is understood that several deposition patterning and overgrowth steps may be needed to produce the right combination of reflective domains such that the reflective elements 170 can have the staggered arrangement illustrated in FIG. 13A. The Bragg mirrors can also be combined with a highly reflective layer. As used herein, a highly reflective layer is a layer that is at least 50% reflective to a normal radiation. For example, the highly reflective layer can include a metallic layer such as aluminum. In another embodiment, the highly reflective layer can include a dielectric or a polymer layer that is diffusively reflective such as polytetrafluoroethylene (PTFE), a highly ultraviolet reflective expanded polytetrafluoroethylene (ePTFE) membrane (e.g., GORE® Diffuse Reflector Material), and/or the like.

Although not shown in the figures, the reflective elements 170 can be incorporated within the n-type contact layer 144. In this manner, the reflective elements 170 can aid in improving light extraction of the optoelectronic device 150.

The top surface 152 of the optoelectronic device 150 can further include a p-type metallic contact 172 having p-type metallic domains 174 formed on the side 168 of the p-type contact layer 142. Each of the p-type metallic domains 174 can be separated from adjacent p-type metallic domains 174 by a predetermined spacing. In one embodiment, as shown in FIGS. 13A-13B, the p-type metallic domains 174 can be separated by a p-type metallic contact domain 164. The p-type metallic domains 174 serve to reflect the light, while the domains 164 can be used primarily for delivering current to the semiconductor structure. In one embodiment, the p-type metallic domains 174 can be made from materials that can include, but are not limited to, UV reflective material, such as aluminum or rhodium.

Regions between the p-type metallic contact domain 164 and the p-type metallic domains 174 can include a transparent or reflective domain 176. It is understood for clarity that only one transparent or reflective domain 176 is shown in FIG. 13B, however, it is understood that more of these domains can be deployed on the top surface 152 of the optoelectronic device 150 In one embodiment, the transparent or reflective domain 176 can include either a UV transparent or partially UV transparent material or reflective Bragg mirrors that act as UV reflective domains. In another embodiment, the domain 176 can include omnidirectional mirrors such as a layer of dielectric and a layer of highly reflective metal. In an embodiment the highly reflective metal can be substituted by a highly ultraviolet reflective expanded polytetrafluoroethylene (ePTFE) membrane (e.g., GORE® Diffuse Reflector Material), and/or the like.

The top surface 152 of the optoelectronic device 150 can also have a passivation layer 178 with or without disjoint domains 180. As shown in FIGS. 13A-13B, the passivation layer 178 and the disjoint domains 180 can be formed on a surface of the p-type contact layer 142. In one embodiment, the passivation layer 178 and the disjoint domains 180 can be formed underneath the metallic p-type contact domain 164. The passivation layer 178 can function to reduce deterioration of the surface, and possible recombination effects at the surface, while the role of the disjoint domains 180 is to reduce absorption of light at the p-type surface. As shown in FIG. 13A, electrical contacts 182 can connect the disjoint domains 180 to the metallic domains 158 of the metallic n-type contact 156 so that the domains 180 can form an electrical network. In one embodiment, the passivation layer 178 can include, but is not limited to, a dielectric material such as $SiO_2$, $Al_2O_3$, $Si_3N_4$, and or the like. In one embodiment, the disjoint domains 180 can include, but are not limited to, nickel and rhodium based domains.

It is understood that not all of the elements described for the optoelectronic device 150 as shown in FIGS. 13A-13C are necessary for use. For example, a regular contact structure can be used in conjunction with the reflective elements 170. As used herein, a regular contact structure is a continuous metallic layer deposited over a semiconductor layer, which is followed by annealing to form a contact to the semiconductor layer. Alternatively, the reflective elements 170 can be absent from the optoelectronic device 150. In such an embodiment, the contact structure can utilize the disjoint domains 180. Alternatively, it is understood that reflective elements 170 that utilize Bragg mirrors do not have to be arranged in a staggered formation and can have other formations. In addition, it is understood that details of the n-type contact layer 144 can also vary. For example, the n-type contact layer 144 can include conductive, partially transparent oxide domains. In addition, the exact position of the roughness elements 162 can also be varied. Furthermore, it is possible that the n-type contact layer 144 can take the form of the structure depicted in FIG. 11A after using a lift-off technique. In this embodiment, then the entire surface 160 of the n-type contact layer 144 can contain roughness elements. Furthermore, the metallic n-type contact 156 and the connected metallic domains 158 of the n-type contact layer 144 can be partially located on the surface 160. In this manner, it would be partially deposited as shown in FIG. 11A.

The optoelectronic device 150 depicted in FIGS. 13A-13C, which can take the form of a vertical device having reflective, transparent and contacts can have several benefits. A first benefit is that there will be vertical current flow in the device that avoids current crowding, which is due to the location of the metallic p-type contact domains 164 and the n-type contact 156. This makes the optoelectronic device 150 suited to operate as a vertical light emitting diode having a vertical structure obtained through a laser lift-off technique. A second benefit is that the optoelectronic device 150 can have a larger emitting area as there is no area required for placing the n-type contact.

FIG. 14 shows a semiconductor heterostructure 190 similar to the structure 111 of FIG. 11A except that the semiconductor heterostructure 190 contains additional elements, e.g., for improved light extraction efficiency. In particular, the semiconductor heterostructure 190 can include a substrate 192 having a side surface 194 with roughness elements 196, which can be configured to improve light extraction from the heterostructure 190 and any optoelectronic device, such as an ultraviolet light emitting diode, that includes the semiconductor heterostructure 190. As shown in FIG. 14, the roughness elements 196 can be formed on an exterior side surface 194 of the substrate 192 that is opposite a side surface near the interface 198 of the substrate 192 and the n-type buffer layer 14.

In one embodiment, the roughness elements 196 can include etched domains having a characteristic size that is at least a wavelength of target radiation, such as a peak wavelength of the radiation emitted by the semiconductor heterostructure 190. As used herein, a characteristic size means an average depth of the roughness elements. In one embodiment, the etched domains of the roughness elements 196 can include truncated pyramids, inverted pyramids, conical elements, and/or the like. The roughness elements 196 can include, but are not limited to, protrusions within the side surface 194 of the substrate 192. In one embodiment, the roughness elements 196 can include externally deposited roughness elements comprising shapes of $Al_2O_3$, $SiO_2$, and/or the like. Furthermore, although FIG. 14 shows the roughness elements 196 formed on the side surface 194 of the substrate 192, it is possible to have the roughness elements formed in other locations about the substrate such as within its internal portion, on a facing portion, an edge portion, and/or the like.

In one embodiment, the roughness elements 196 can be fabricated using etching. The patterned roughness elements 196 serve to improve light extraction, e.g., by reducing total internal reflection from an exit surface of the substrate 192. The patterned roughness elements 196 can have a periodic structure or an aperiodic structure. In an embodiment, the patterned roughness elements 196 can form photonic crystals each having a characteristic size that is comparable to the wavelength of the target radiation (e.g., the peak radiation emitted by the semiconductor heterostructure 190). As used herein, a characteristic size that is comparable means a characteristic size within +/−50% of the wavelength of the target radiation. The roughness elements 196 can be patterned using well-known techniques that can include, but are not limited to, etching, deposition, mechanical roughening, and/or the like.

To further improve light extraction from the semiconductor heterostructure 190, the substrate 192 can include a patterned side surface 200 with spaced protruding regions 202 at the interface 198 of the substrate 192 with the n-type buffer layer 14. The patterned side surface 200 with spaced protruding regions 202 can aid in improving light extraction from the semiconductor heterostructure 190, e.g., by promoting the scattering of light having Total Internal Reflection (TIR) at the interface 198 between the n-type buffer layer 14 and the substrate 192. It is understood that both the patterned side surface 200 with spaced protruding regions 202 and the roughness elements 196 can be combined together to yield an improved light extraction for the semiconductor heterostructure 190.

As shown in FIG. 14, each protruding region 202 can comprise a substantially flat top surface. In one embodiment, each protruding region 202 can comprise a hexagonal lateral cross-sectional pattern and/or the protruding regions 202 can be arranged to form a lateral hexagonal pattern. However, it is understood that the protruding regions 202 can comprise any combination of one or more of various types/shapes of cross-sectional patterns and form any type of pattern. In one embodiment, each protruding region 202 can have a base that is approximately 3.5 microns (μm) wide, while a top surface can have a width of approximately 2.0 μm, and a height of approximately 0.65 μm. In an embodiment, a characteristic size of the plurality of protruding regions 202 can be between approximately 0.1 microns and approximately 5.0 microns. Furthermore, a characteristic size of the spacings formed between the plurality of protruding regions 202 can have a size less than or equal to the characteristic size of the plurality of protruding regions 202. As used herein, the term "approximately" means within +/− ten percent of the stated value.

The patterned side surface 200 with protruding regions 202 can be obtained using any one of the well-known techniques that are available. Lithography and etching are examples of techniques that are suitable for obtaining the patterned side surface 200 with protruding regions 202. In one embodiment, the patterned side surface 200 with protruding regions 202 can be formed using photolithography and wet chemical etching. However, it is understood that other types of lithography, such as e-beam, stepper, and/or the like, and/or other types of etching, such as dry etching, can be used.

In addition to improving light extraction of the semiconductor heterostructure 190, the patterned side surface 200 with protruding regions 202 can improve the epitaxial growth of semiconductor layers thereon, such as the n-type buffer layer 14, the n-type contact layer 116A, the active region 18 and the p-type contact layer 22 on the substrate 192. In particular, the patterned side surface 200 with protruding regions 202 can improve the epitaxial growth through a technique known as Epitaxial Lateral Overgrowth (ELO).

In one embodiment, the patterned side surface 200 with protruding regions 202 can have a periodic structure or an aperiodic structure. In another embodiment, the patterned side surface 200 with protruding regions 202 can form photonic crystals each having a characteristic size that is comparable to the wavelength of the target radiation. The patterned side surface 200 with protruding regions 202 can be patterned using well-known techniques. U.S. Pat. No. 8,981,403 entitled "Patterned Substrate Design For Layer Growth," provides further details of one approach that can be used to obtain the patterned side surface 200 with protruding regions 202, as well as other details on selecting and applying patterning to a surface in a semiconductor heterostructure, and is incorporated herein by reference.

In one embodiment, the substrate 192 can include an ultraviolet transparent material. As used herein, an ultraviolet transparent substrate is a substrate that is at least 80% transparent to normally directed radiation having a target wavelength. In one embodiment, an ultraviolet transparent substrate that is suitable for use as the substrate 192 can include, but is not limited to, sapphire, AlN, or a combination thereof. In an embodiment, an ultraviolet transparent substrate also can include one or more domains containing $SiO_2$.

The improved efficiency of light extraction from the semiconductor heterostructure 190 that is facilitated by the ultraviolet transparent substrate 192 with its roughness elements 196 and/or patterned side surface 200 with protruding regions 202 can be further enhanced by the reflective regions 118 (e.g., composite mirrors) embedded within the n-type contact layer 116A. In particular, the reflective regions 118 can allow partial trapping of the light in the regions within the n-type contact layer 116A and the n-type buffer layer 14, which as noted above can be ultraviolet transparent. As a result, the substrate 192, the reflective regions 118, the n-type contact layer 116A, and the n-type buffer layer 14 can collectively function to provide an overall increase in the light extraction from the semiconductor heterostructure 190. In addition to being ultraviolet transparent as described herein, the n-type contact layer 116A and the n-type buffer layer 14 can include n-type $Al_xGa_{1-x}N$ layers with a molar fraction x chosen to be transparent to ultraviolet radiation emitted by the active region 18 to further enhance the efficiency of the light extraction of the semiconductor heterostructure 190.

FIG. 15 shows a semiconductor heterostructure 204 that is an alternative to the semiconductor heterostructure 190 depicted in FIG. 14. The semiconductor heterostructure 204 differs from the semiconductor heterostructure 190 of FIG. 14 in that the patterned side surface 200 with protruding regions 202 is replaced by a patterned side surface 206 with masking regions 208 that serve to improve the epitaxial growth quality of semiconductor layers through the process of epitaxial lateral overgrowth (ELO) and/or to provide for scattering domains for improving light extraction efficiency. In one embodiment, the masking regions 208 can have reflective elements or scattering elements. The masking regions 208 with scattering centers or centers with reflective properties function to extract light from the semiconductor heterostructure. The masking regions 208 can include a material that includes, but is not limited to, $SiO_2$, AlN, AlGaN, AAO, $CaF_2$, $MgF_2$ and/or the like. In one embodiment, the masking regions 208 with reflective elements can each have a reflectance that is at least 30% of the target radiation. The masking regions 208 of reflective elements can have material that includes, but is not limited to, AAO, aluminum, rhodium and or the like.

In one embodiment, the masking regions 208 with scattering elements can provide a scattering that is at least 10% Lambertian. The masking regions 208 with scattering elements can include, but are not limited to, Bragg reflective elements and polycrystalline sapphire, $SiO_2$, AAO and/or the like. In one embodiment, the Bragg reflective elements can include a laminate structure of $SiO_2$ and $HfO_2$. Alternatively, the Bragg reflective elements can include laminate elements of $SiO_2/Al_2O_3$ or similar ultraviolet transparent materials such as $MgF_2$ or $CaF_2$. The masking regions 208, including those having reflective elements and scattering elements, can be formed on the patterned surface 206 using well known techniques. These techniques can include but are not limited to, photolithography.

Figure 16:
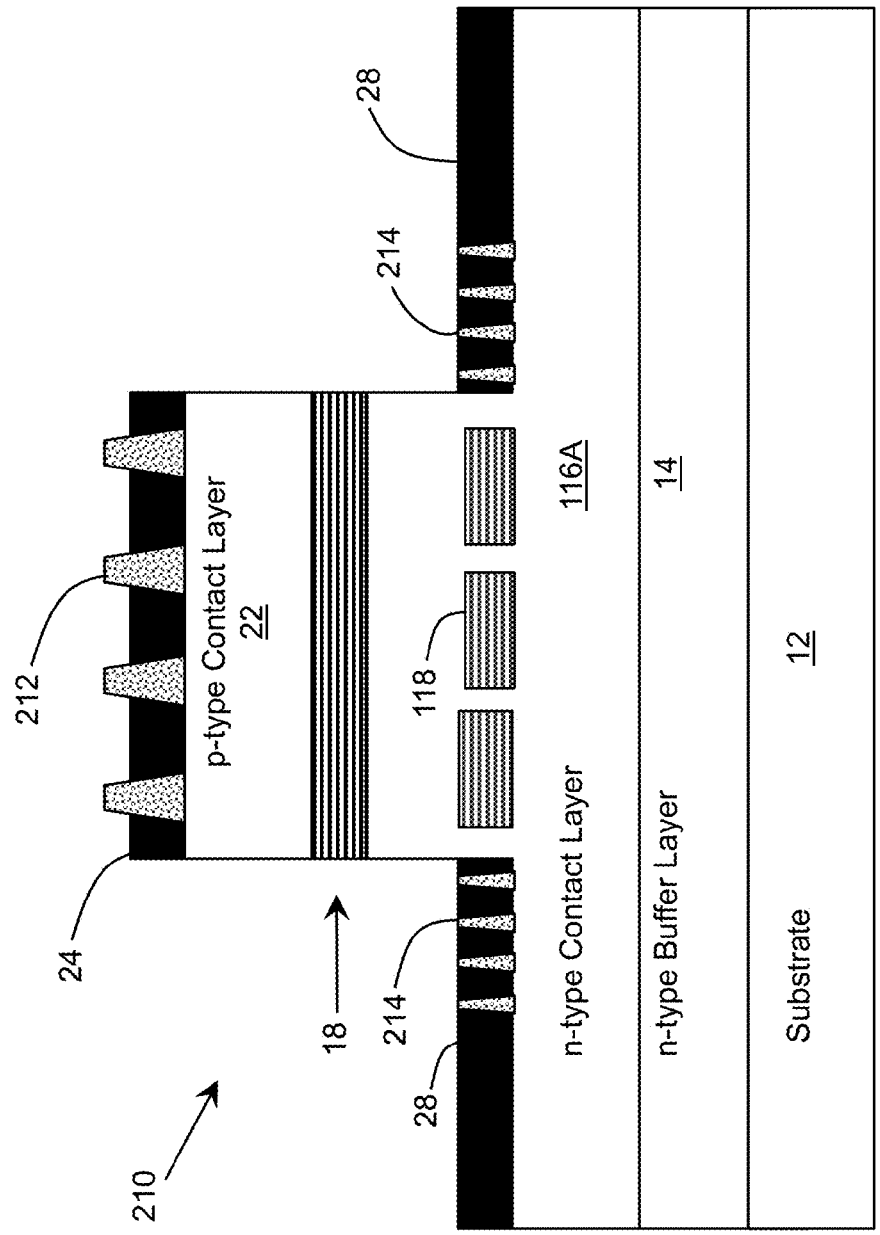
FIG. 16 shows a semiconductor heterostructure with metal layers having scattering elements incorporated therein according to an embodiment.

FIG. 16 shows a semiconductor heterostructure 210 similar to the semiconductor heterostructure 10 depicted in FIG. 2, however, the metal layers of the heterostructure 210 have scattering elements incorporated therein according to an embodiment. In particular, the p-type metal layer 24 formed over the p-type contact layer 24 and the n-type metal layer 28 formed over the n-type contact layer 116A have scattering elements 212 and 214 located therein, respectively. The scattering elements 212 and 214 operate in conjunction with the reflective elements 118 to promote light extraction from the semiconductor heterostructure. As a result, the scattering elements 212, 214 and the reflective elements 118 effectively convert the radiation having TIR into radiation capable of being extracted from an optoelectronic device formed from the semiconductor heterostructure 210.

The scattering elements 212, 214 can be disposed in the p-type contact layer 24 and the n-type metal layer 28, respectively, to have a uniform spacing as shown in FIG. 16. However, those skilled in the art will appreciate that the scattering elements 212, 214 can be disposed in the p-type metal layer 24 and the n-type metal layer 28, respectively, with different spacing configurations. Furthermore, the scattering elements 214 can be disposed in the n-type metal layer 28 at a predetermined lateral distance away from the active region 18, the p-type contact layer 22 and the p-type metal layer 24 in order to facilitate efficient light extraction in the semiconductor heterostructure 210. However, it is understood that the scattering elements 214 can be disposed in the n-type metal layer 28 at a distance that extends further away from the active region 18, the p-type contact layer 22 and the p-type metal layer 24 if desired.

In one embodiment, the scattering elements 212, 214 can provide a scattering that is at least 10% Lambertian. The scattering elements 212, 214 can have materials that include, but are not limited to, polycrystalline sapphire, $SiO_2$, AAO and/or the like. The scattering elements 212, 214 can be formed in the p-type metal layer 24 and the n-type metal layer 28 using well known techniques. These techniques can include but are not limited to, photolithography.

Various embodiments of the semiconductor structures described herein can be fabricated using any solution, including patterning, masking, epitaxial growth, and/or the like. An illustrative solution for producing a laterally inhomogeneous semiconductor structure includes depositing group III nitride semiconductor alloys under a faceted and/or three-dimensional growth mode as shown and described in U.S. Pat. No. 7,812,366. This solution is notably different from conventional approaches of growing AlGaN films and can lead to a surface morphology having large scale faceting evidencing metal droplets. In conventional approaches, the films are typically produced at a very high gallium flux, which results in a surface of the AlGaN film typically having a smooth morphology. In another embodiment described herein, inhomogeneous regions within a semiconductor structure can be produced using a MOCVD approach, which is distinctly different from the approach described in U.S. Pat. No. 7,812,366.

Ternary and quaternary nitride semiconductor epitaxial layers inherently grow inhomogeneously due to contrasting optimum growth conditions needed for respective binary layers. In an embodiment, inhomogeneity in aluminum-containing nitride layers is further enhanced by intentionally lowering a mobility of aluminum adatoms. For example, aluminum mobility on the growing surface is strongly influenced by growth temperature and V/III molar ratio. In an illustrative embodiment, three dimensional inhomogeneous structures are formed with V/III ratio being above 1000 (e.g., in a range between 1000 and 100000) and growth temperatures being in the range of 500-1300 degrees Celsius. Adjacent semiconductor layers can be grown using such a group V/III ratio and growth temperatures, while varying a molar fraction of one or more of the elements (e.g., a molar fraction of aluminum can differ by at least one percent between adjacent layers).

Figure 17:
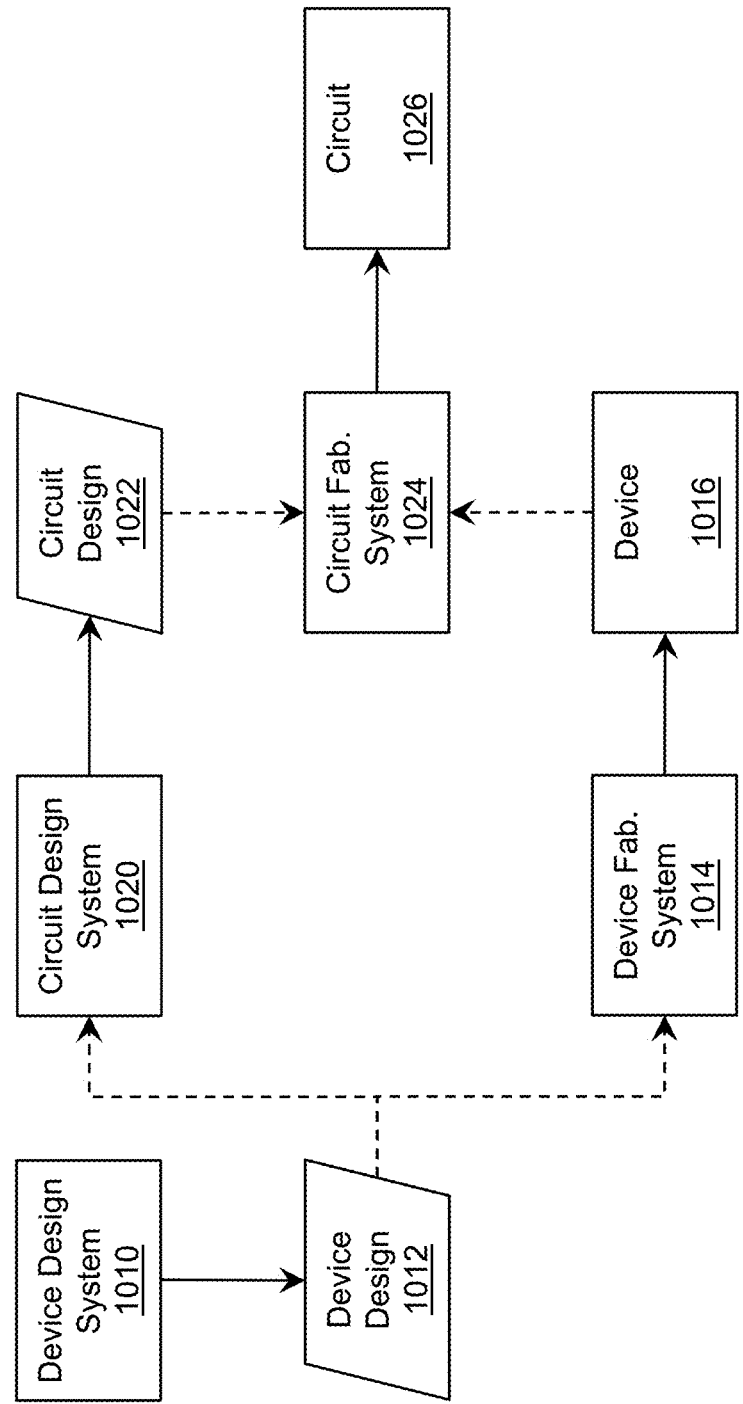
FIG. 17 shows an illustrative flow diagram for fabricating a circuit according to an embodiment.

In one embodiment, the invention provides a method of designing and/or fabricating a circuit that includes one or more of the devices designed and fabricated as described herein (e.g., including one or more emitting devices including a semiconductor structure described herein). To this extent, FIG. 17 shows an illustrative flow diagram for fabricating a circuit 1026 according to an embodiment. Initially, a user can utilize a device design system 1010 to generate a device design 1012 for a semiconductor device as described herein. The device design 1012 can comprise program code, which can be used by a device fabrication system 1014 to generate a set of physical devices 1016 according to the features defined by the device design 1012. Similarly, the device design 1012 can be provided to a circuit design system 1020 (e.g., as an available component for use in circuits), which a user can utilize to generate a circuit design 1022 (e.g., by connecting one or more inputs and outputs to various devices included in a circuit). The circuit design 1022 can comprise program code that includes a device designed as described herein. In any event, the circuit design 1022 and/or one or more physical devices 1016 can be provided to a circuit fabrication system 1024, which can generate a physical circuit 1026 according to the circuit design 1022. The physical circuit 1026 can include one or more devices 1016 designed as described herein.

In another embodiment, the invention provides a device design system 1010 for designing and/or a device fabrication system 1014 for fabricating a semiconductor device 1016 as described herein. In this case, the system 1010, 1014 can comprise a general purpose computing device, which is programmed to implement a method of designing and/or fabricating the semiconductor device 1016 as described herein. Similarly, an embodiment of the invention provides a circuit design system 1020 for designing and/or a circuit fabrication system 1024 for fabricating a circuit 1026 that includes at least one device 1016 designed and/or fabricated as described herein. In this case, the system 1020, 1024 can comprise a general purpose computing device, which is programmed to implement a method of designing and/or fabricating the circuit 1026 including at least one semiconductor device 1016 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 1010 to generate the device design 1012 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 1010 for designing and/or a device fabrication system 1014 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A semiconductor heterostructure, comprising:
   an active region configured to at least one of: emit or sense, target radiation having a target wavelength;
   a contact; and
   a group III nitride semiconductor layer located between the active region and the contact, the group III semiconductor layer including a plurality of inhomogeneous regions arranged within multiple levels of the semiconductor layer, each having a set of attributes differing from a group III nitride material forming the group III semiconductor layer, wherein the plurality of inhomogeneous regions include at least one reflective region and at least one conductive region.

2. The semiconductor heterostructure of claim 1, wherein the at least one reflective region comprises a set of low refractive index sublayers alternating with a set of highly reflective sublayers.

3. The semiconductor heterostructure of claim 2, wherein a thickness of each sublayer in the at least one reflective region is approximately a quarter of the target wavelength.

4. The semiconductor heterostructure of claim 2, wherein at least one of the set of low refractive index sublayers includes a set of conductive sub-regions forming a set of passages through the at least one of the set of low refractive index sublayers.

5. The semiconductor heterostructure of claim 2, wherein the set of low refractive index sublayers include a material selected from: silicon dioxide, aluminum oxide, or a group III nitride.

6. The semiconductor heterostructure of claim 2, wherein each sublayer in the at least one reflective region is formed of a group III nitride composition.

7. The semiconductor heterostructure of claim 1, wherein the at least one reflective region forms an omnidirectional mirror.

8. The semiconductor heterostructure of claim 1, wherein at least one of the at least one reflective region penetrates the contact.

9. The semiconductor heterostructure of claim 1, wherein the contact is a p-type contact.

10. A method, comprising:
    fabricating a semiconductor heterostructure, wherein the semiconductor heterostructure comprises:
    an active region configured to at least one of: emit or sense, target radiation having a target wavelength; and
    a single group III nitride semiconductor layer located adjacent to the active region, the group III semiconductor layer including a plurality of inhomogeneous regions arranged within multiple levels of the semiconductor layer, each having a set of attributes differing from a group III nitride material forming the group III semiconductor layer, wherein the plurality of inhomogeneous regions include at least one reflective region and at least one conductive region.

11. The method of claim 10, further comprising forming a contact immediately adjacent to the group III nitride semiconductor layer.

12. The method of claim 10, wherein the fabricating includes:
    epitaxially growing a portion of the group III nitride semiconductor layer;
    forming at least one of the sets of inhomogeneous regions on a surface of the portion of the group III nitride semiconductor layer; and
    epitaxially over-growing the group III nitride semiconductor layer after the forming.

13. The method of claim 12, wherein the forming includes:
    depositing the at least one of the sets of inhomogeneous regions using one of: thermal evaporation, magnetron sputtering, ion-beam deposition, or laser beam evaporation; and
    patterning the at least one of the sets of inhomogeneous regions using photolithography.

14. An optoelectronic device, comprising:
    an active region configured to at least one of: emit or sense, target radiation having a target wavelength;
    a p-type contact layer located on a first side of the active region;
    a n-type contact layer located on a second side of the active region, the n-type contact layer including a group III nitride semiconductor layer including a plurality of inhomogeneous regions, each inhomogeneous region having a set of attributes differing from a group III nitride material forming the group III semiconductor layer, wherein the plurality of inhomogeneous regions include a plurality of reflective regions each reflective of radiation having the target wavelength;

a buffer layer located on a first side of the n-type contact layer opposite a second side thereof that is located adjacent to the active region; and a transparent substrate, located on a first side of the buffer layer opposite a second side thereof that is located adjacent to the n-type contact layer, wherein the transparent substrate is at least 80% transparent to a normally directed target radiation.

15. The optoelectronic device of claim 14, wherein the transparent substrate comprises a plurality of roughness elements on a first side of the transparent substrate opposite a second side thereof that is located adjacent to the buffer layer.

16. The optoelectronic device of claim 15, wherein each of the roughness elements has a characteristic size that is at least the characteristic size of the target wavelength of the target radiation.

17. The optoelectronic device of claim 15, wherein the second side of the transparent substrate comprises a plurality of masking regions.

18. The optoelectronic device of claim 17, wherein the plurality of masking regions comprise one of reflective elements and scattering elements.

19. The optoelectronic device of claim 14, further comprising a p-type metal layer formed over the p-type contact layer and a n-type metal layer formed over the n-type contact layer.

20. The optoelectronic device of claim 19, further comprising a plurality of scattering elements located in each of the p-type metal layer and the n-type metal layer.

\* \* \* \* \*